US006953938B2

(12) United States Patent
Iwasaki et al.

(10) Patent No.: US 6,953,938 B2
(45) Date of Patent: Oct. 11, 2005

(54) DEFLECTOR, METHOD OF MANUFACTURING DEFLECTOR, AND CHARGED PARTICLE BEAM EXPOSURE APPARATUS

(75) Inventors: Yuichi Iwasaki, Tochigi (JP); Masato Muraki, Tokyo (JP); Kenji Tamamori, Kanagawa (JP); Kouji Asano, Tokyo (JP); Masayoshi Esashi, Miyagi (JP); Yoshinori Nakayama, Tokyo (JP); Shinichi Hashimoto, Tokyo (JP); Yoshiaki Moro, Tokyo (JP)

(73) Assignees: Canon Kabushiki Kaisha, Tokyo (JP); Hitachi, Ltd., Tokyo (JP)

( * ) Notice: Subject to any disclaimer, the term of this patent is extended or adjusted under 35 U.S.C. 154(b) by 60 days.

(21) Appl. No.: 10/670,328

(22) Filed: Sep. 26, 2003

(65) Prior Publication Data

US 2005/0035300 A1 Feb. 17, 2005

(30) Foreign Application Priority Data

| Oct. 3, 2002 | (JP) | ............................... 2002-291709 |
| Oct. 3, 2002 | (JP) | ............................... 2002-291710 |
| Oct. 28, 2002 | (JP) | ............................... 2002-313423 |

(51) Int. Cl.[7] .......................................... H01J 37/304
(52) U.S. Cl. ............................... 250/396 R; 250/492.2
(58) Field of Search ......................... 250/396 R, 492.2

(56) References Cited

U.S. PATENT DOCUMENTS

| 5,864,142 A | 1/1999 | Muraki et al. ............ 250/491.1 |
| 5,905,267 A | 5/1999 | Muraki ................... 250/492.22 |
| 5,929,454 A | 7/1999 | Muraki et al. ............ 250/491.1 |
| 5,939,725 A | 8/1999 | Muraki ................... 250/492.22 |
| 5,981,954 A | 11/1999 | Muraki ....................... 250/397 |
| 6,054,713 A | 4/2000 | Miyake et al. .......... 250/492.24 |
| 6,104,035 A | 8/2000 | Muraki ................... 250/492.22 |
| 6,107,636 A | 8/2000 | Muraki ..................... 250/492.2 |
| 6,124,599 A | 9/2000 | Muraki ................... 250/492.22 |
| 6,125,522 A * | 10/2000 | Nakasuji ....................... 29/458 |
| 6,137,113 A | 10/2000 | Muraki ................... 250/492.22 |
| 6,392,243 B1 | 5/2002 | Muraki ..................... 250/491.1 |
| 6,465,783 B1 * | 10/2002 | Nakasuji ...................... 250/311 |
| 6,466,301 B1 | 10/2002 | Yui et al. ....................... 355/53 |
| 6,472,672 B1 | 10/2002 | Muraki ..................... 250/492.2 |
| 6,552,353 B1 | 4/2003 | Muraki ..................... 250/492.2 |
| 6,559,456 B1 | 5/2003 | Muraki ..................... 250/491.1 |
| 6,559,463 B2 | 5/2003 | Ono et al. .............. 250/492.22 |
| 6,566,664 B2 | 5/2003 | Muraki ..................... 250/492.2 |
| 6,583,430 B1 | 6/2003 | Muraki ................... 250/492.22 |
| 6,802,986 B2 * | 10/2004 | Nakano ......................... 216/13 |
| 6,872,950 B2 * | 3/2005 | Shimada et al. ......... 250/396 R |
| 2002/0160311 A1 | 10/2002 | Muraki et al. .............. 430/296 |
| 2002/0179855 A1 | 12/2002 | Muraki ................... 250/492.22 |

* cited by examiner

Primary Examiner—John R. Lee
Assistant Examiner—Paul M. Gurzo
(74) Attorney, Agent, or Firm—Fitzpatrick, Cella, Harper & Scinto

(57) ABSTRACT

A deflector which deflects a charged particle beam includes a substrate having an opening through which the charged particle beam should pass, and a deflection electrode which is arranged in the opening to deflect the charged particle beam and has a first conductive member and second conductive member, which are formed by plating. The second conductive member is formed on the surface of the first conductive member and is made of a material that is more difficult to oxidize than the first conductive member. The first conductive member is made of a material having smaller residual stress than the second conductive member.

5 Claims, 21 Drawing Sheets

DEFLECTOR, METHOD OF MANUFACTURING DEFLECTOR, AND CHARGED PARTICLE BEAM EXPOSURE APPARATUS

FIELD OF THE INVENTION

The present invention relates to a charged particle beam exposure apparatus which exposes the pattern of a semiconductor integrated circuit or the like onto a wafer and, more particularly, to a deflector in a charged particle beam exposure apparatus which exposes a pattern by using a plurality of charged particle beams and a method of manufacturing the deflector.

BACKGROUND OF THE INVENTION

Along with the recent size reduction of semiconductor devices, various kinds of lithography means for 100 nm or less have been proposed. There are also requirements for high resolution, accurate lithography pattern overlay, and high throughput. Electron beam exposure apparatuses inherently ensure a high resolution and also have satisfactory dimension controllability as compared to other exposure means. Since the electron beam exposure apparatuses can electrically generate an exposure pattern and directly expose a wafer, they are expected as maskless exposure means.

In the electron beam exposure apparatuses, however, the exposure area per shot is small, and the throughput is low. For these reasons, they are not widely used for mass production of semiconductor devices. To solve these problems, a multi-electron beam exposure apparatus which exposes a wafer by using a plurality of electron beams simultaneously has been proposed.

Such a multi-electron beam exposure apparatus comprises a blanking aperture array device which switches a plurality of electron beams between an independent deflection mode and another mode, and an electron beam shielding section which shields the wafer from the electron beams deflected by the blanking aperture array device. With these units, whether the wafer is to be irradiated with each of the plurality of electron beams is accurately controlled. The blanking aperture array device has a substrate such as a semiconductor substrate having a plurality of openings (also called through holes), deflection electrodes formed in the openings, and an insulating layer which insulates the substrate from the deflection electrodes. Whether an electron beam that passes through an opening is to be deflected is controlled by ON/OFF-controlling voltage application to the deflection electrode.

In the conventional blanking aperture array device manufacturing process, openings each having a high aspect ratio are formed in a substrate. A deflection electrode is formed in each of the openings by plating. Since the deflection electrode is formed by plating in the opening having a high aspect ratio, a material whose plating growth rate is low cannot be selected as the material of the deflection electrode. In addition, if the deflection electrode is oxidized, it becomes difficult to appropriately deflect an electron beam and control its position. To prevent this, a material that is hard to oxidize must be selected as the material of the deflection electrode. It is difficult to select the deflection electrode material that meets the above requirements.

In the conventional structure of the blanking aperture array device, the substrate or insulating layer is partially exposed to the inner wall of each opening through which an electron beam passes. For this reason, the oxide film of the substrate or the insulating layer, which is exposed to the inner wall of the opening, is charged up and affects the electron beam that passes through the opening. Accordingly, the electron beam cannot be appropriately deflected or position-controlled. Hence, it is difficult to accurately expose the wafer.

In the conventional blanking aperture array device manufacturing process, openings are formed in a substrate, and an insulating layer is formed on the inner wall of each opening. At a position adjacent to the insulating layer, a deflection electrode is formed by plating using a conductive layer formed on the surface of the substrate as an electrode. The deflection electrode has residual stress and therefore poor adhesion to the insulating layer. For this reason, the deflection electrode readily peels off from the insulating layer.

Under these circumstances, a deflector, a method of manufacturing the same, and a charged particle beam exposure apparatus, which can solve the above problems, are demanded.

SUMMARY OF THE INVENTION

According to one aspect of the present invention, there is provided a deflector which deflects a charged particle beam, comprising: a substrate having an opening through which the charged particle beam should pass; and a deflection electrode which is arranged in the opening to deflect the charged particle beam and has a first conductive member and second conductive member which are formed by plating, wherein the second conductive member is formed on a surface of the first conductive member and is essentially made of a material that is more difficult to oxidize than the first conductive member.

According to another aspect of the present invention, there is provided a deflector which deflects a charged particle beam, comprising: a substrate having an opening through which the charged particle beam should pass; a first deflection electrode and second deflection electrode which oppose each other in the opening to deflect the charged particle beam; and a first conductive layer and second conductive layer which oppose each other in the opening in a direction substantially perpendicular to a direction from the first deflection electrode to the second deflection electrode and are made of a material having a higher conductivity than the substrate.

Furthermore, according to another aspect of the present invention, there is provided a deflector which deflects a charged particle beam, comprising: a substrate having a through hole through which the charged particle beam should pass and two groove portions respectively formed on two opposing side surfaces inside the through hole; and two deflection electrodes which are at least partially buried in the two groove portions, wherein each of the groove portions has a shape to lock the buried portion of the deflection electrode in the groove portion to prevent the deflection electrode from separating from the substrate.

According to another aspect of the present invention, there is provided a method of manufacturing the deflector.

According to still another aspect of the present invention, there is provided a charged particle beam exposure apparatus using the deflector.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Although the present invention will be described below on the basis of the embodiments of the invention, the embodiments to be described below do not limit the invention of appended claims. In addition, all combinations of characteristic features described in the embodiments are not always essential to the solving means of the invention.

[First Embodiment]

Figure 1:
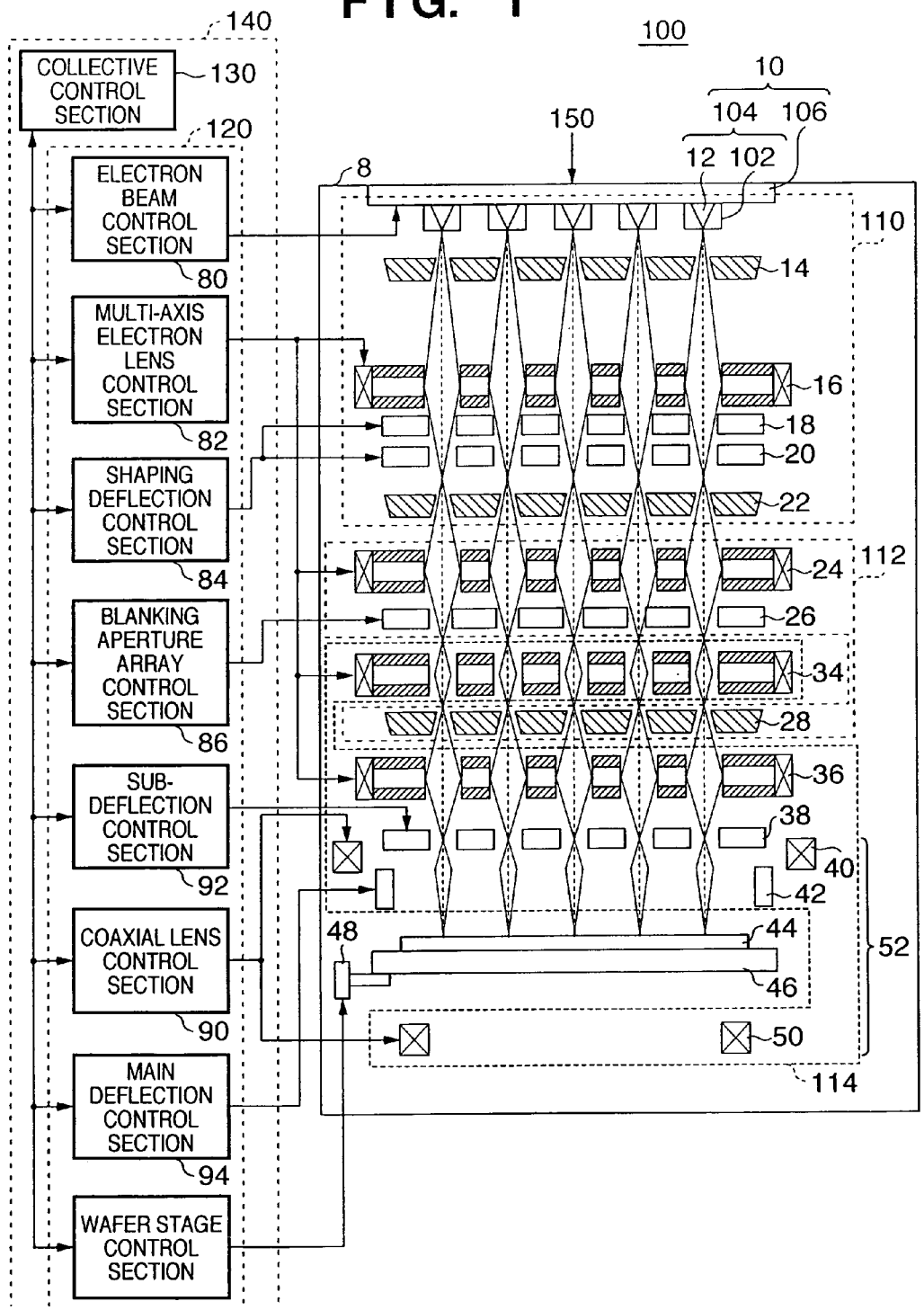
FIG. 1 is a view showing the arrangement of an electron beam exposure apparatus 100 according to an embodiment.

FIG. 1 shows the arrangement of an electron beam exposure apparatus 100 according to the first embodiment. The electron beam exposure apparatus 100 is an example of the charged particle beam exposure apparatus of the present invention. The charged particle beam exposure apparatus of the present invention may be an ion beam exposure apparatus which exposes a wafer by an ion beam. The electron beam exposure apparatus 100 may generate a plurality of electron beams at a short interval and, for example, at such an interval that one chip region to be formed on a wafer is irradiated with all electron beams.

The electron beam exposure apparatus 100 comprises an exposure section 150 which executes predetermined exposure processing for a wafer 44 by electron beams and a control section 140 which controls the operations of components included in the exposure section 150.

The exposure section 150 comprises an electron optical system and a stage system. The electron optical system includes an electron beam shaping means 110 for generating a plurality of electron beams in a housing 8 and forming the sectional shape of each electron beam into a desired shape, an irradiation switching means 112 for independently switching for each of the plurality of electron beams whether the wafer 44 should be irradiated with the electron beam, and a wafer projecting system 114 which adjusts the direction and size of the image of a pattern to be transferred to the wafer 44. The stage system has a wafer stage 46 on which the wafer 44 to which the pattern is to be exposed is placed and a wafer stage driving section 48 which drives the wafer stage 46.

The electron beam shaping means 110 has an electron beam generation section 10 which generates the plurality of electron beams, a first shaping member 14 and second shaping member 22 each of which has a plurality of opening portions that shape the sectional shapes of the electron beams, a first multi-axis electron lens 16 which independently focuses the plurality of electron beams and adjusts the focal points of the electron beams, and a first shaping deflecting section 18 and second shaping deflecting section 20 each of which independently deflects the plurality of electron beams that have passed through the first shaping member 14. The electron beam generation section 10 is an example of the charged particle beam generation section of the present invention. The first shaping deflecting section 18 and second shaping deflecting section 20 are examples of the deflector of the present invention.

The electron beam generation section 10 has a plurality of electron guns 104 and a base 106 on which the electron guns 104 are formed. Each electron gun 104 has a cathode 12 which generates thermoelectrons and a grid 102 which is formed around the cathode 12 to stabilize the thermoelectrons generated by the cathode 12. In the electron beam generation section 10, the plurality of electron guns 104 are formed on the base 106 at a predetermined interval so that an electron gun array is formed.

Each of the first shaping member 14 and second shaping member 22 preferably has a grounded metal film of platinum or the like on the surface that is irradiated with the electron beams. Each of the plurality of opening portions included in the first shaping member 14 and second shaping member 22 may have a sectional shape that extends along the electron beam irradiation direction to efficiently pass the electron beam. The plurality of opening portions included in the first shaping member 14 and second shaping member 22 are preferably formed into a rectangular shape.

The irradiation switching means 112 has a second multi-axis electron lens 24 which independently focuses the plurality of electron beams and adjusts the focal points of the electron beams, a blanking aperture array device 26 which independently switches for each of the electron beams whether the wafer 44 should be irradiated with the electron beam by independently deflecting the electron beams, and an electron beam shielding member 28 which includes a plurality of opening portions through which the electron beams pass and shields the electron beams deflected by the blanking aperture array device 26. The blanking aperture array device 26 is an example of the deflector of the present invention.

The blanking aperture array device 26 has a substrate having openings through which the electron beams should pass, and a plurality of deflection electrodes formed in the openings. Each of the plurality of opening portions included in the electron beam shielding member 28 may have a sectional shape that extends along the electron beam irradiation direction to efficiently pass the electron beam.

The wafer projecting system 114 has a third multi-axis electron lens 34 which independently focuses the plurality of electron beams and reduces the irradiation diameters of the electron beams, a fourth multi-axis electron lens 36 which independently focuses the plurality of electron beams and adjusts the focal points of the electron beams, a sub-deflecting section 38 serving as an independent deflecting portion section which independently deflects the plurality of electron beams to desired positions on the wafer 44, a coaxial lens 52 which has a first coil 40 and second coil 50 for focusing the electron beams and functions as an objective lens, and a main deflecting section 42 serving as a common deflecting section which deflects the plurality of electron beams by a desired amount to almost the same direction. The sub-deflecting section 38 is an example of the deflector of the present invention.

The main deflecting section 42 is preferably an electrostatic deflector capable of rapidly deflecting a plurality of electron beams by using an electric field and has opposing deflection electrodes. The main deflecting section 42 may have a cylindrical uniform 8-pole structure including four sets of opposing deflection electrodes or a structure including eight or more deflection electrodes. The blanking aperture array device 26 has one set of opposing deflection electrodes. The coaxial lens 52 is preferably arranged to be closer to the wafer 44 than the fourth multi-axis electron lens 36.

The control section 140 comprises a collective control section 130 and individual control section 120. The individual control section 120 has an electron beam control section 80, a multi-axis electron lens control section 82, a shaping deflection control section 84, a blanking aperture array control section 86, a coaxial lens control section 90, a sub-deflection control section 92, a main deflection control section 94, and a wafer stage control section 96. The collective control section 130 is, e.g., a workstation which collectively controls the control sections included in the individual control section 120.

The electron beam control section 80 controls the electron beam generation section 10. The multi-axis electron lens control section 82 controls a current to be supplied to the first multi-axis electron lens 16, second multi-axis electron lens 24, third multi-axis electron lens 34, and fourth multi-axis electron lens 36. The shaping deflection control section 84 controls the first shaping deflecting section 18 and second shaping deflecting section 20. The blanking aperture array control section 86 controls a voltage to be applied to the deflection electrodes included in the blanking aperture array device 26. The coaxial lens control section 90 controls a current to be supplied to the first coil 40 and second coil 50 which are included in the coaxial lens 52. The main deflection control section 94 controls a voltage to be applied to the deflection electrodes included in the main deflecting section 42. The wafer stage control section 96 controls the wafer stage driving section 48 to move the wafer stage 46 to a predetermined position.

The operation of the electron beam exposure apparatus 100 will be described. First, the electron beam generation section 10 generates a plurality of electron beams. The first shaping member 14 is irradiated with the electron beams generated by the electron beam generation section 10 so that the electron beams are shaped. The plurality of electron beams that have passed through the first shaping member 14 have rectangular shapes corresponding to the shapes of the opening portions included in the first shaping member 14.

The first multi-axis electron lens 16 independently focuses the plurality of electron beams having the rectangular shapes and independently adjusts the focal point of each electron beam with respect to the second shaping member 22. The first shaping deflecting section 18 independently deflects each of the plurality of electron beams having the rectangular shapes to a desired position of the second shaping member. The second shaping deflecting section 20 independently deflects the plurality of electron beams, deflected by the first shaping deflecting section 18, almost perpendicularly to the second shaping member 22. As a result, each electron beam is adjusted such that it almost perpendicularly irradiates a desired position of the second shaping member 22. The second shaping member 22 including a plurality of opening portions each having a rectangular shape further shapes the plurality of electron beams each having a rectangular sectional shape and irradiating a corresponding opening portion, thereby forming electron beams each of which has a desired rectangular sectional shape and should irradiate the wafer 44.

The second multi-axis electron lens 24 independently focuses the plurality of electron beams and adjusts the focal points of the electron beams with respect to the blanking aperture array device 26. The electron beams having focal points adjusted by the second multi-axis electron lens 24 pass through the plurality of opening portions included in the blanking aperture array device 26.

The blanking aperture array control section 86 controls whether a voltage is to be applied to the deflection electrode formed in each opening of the blanking aperture array device 26. On the basis of whether a voltage is to be applied to the deflection electrode, the blanking aperture array device 26 ON/OFF-controls electron beam irradiation of the wafer 44. When a voltage is applied to the deflection electrode, the electron beam that has passed through the opening of the blanking aperture array device 26 is deflected. Hence, the electron beam cannot pass through the opening portion included in the electron beam shielding member 28 so that the wafer 44 is not irradiated with the electron beam. When no voltage is applied to the deflection electrode, the electron beam that has passed through the opening of the blanking aperture array device 26 is not deflected. Hence, the electron beam can pass through the opening portion included in the electron beam shielding member 28 so that the wafer 44 is irradiated with the electron beam.

The third multi-axis electron lens 34 reduces the diameter of each electron beam which is not deflected by the blanking aperture array device 26 and passes the electron beam through an opening portion included in the electron beam shielding member 28. The fourth multi-axis electron lens 36 independently focuses the plurality of electron beams and adjusts the focal points of the electron beams with respect to the sub-deflecting section 38. The electron beams having the adjusted focal points become incident on the deflectors included in the sub-deflecting section 38.

The sub-deflection control section 92 independently controls the plurality of deflectors included in the sub-deflecting section 38. The sub-deflecting section 38 independently deflects the plurality of electron beams incident on the plurality of deflectors to desired exposure positions of the wafer 44. The focal points of the plurality of electron beams that have passed through the sub-deflecting section 38 are adjusted with respect to the wafer 44 by the coaxial lens 52 having the first coil 40 and second coil 50 so that the wafer 44 is irradiated with the electron beams.

During exposure processing, the wafer stage control section 96 controls the wafer stage driving section 48 to move the wafer stage 46 to a predetermined direction. On the basis of exposure pattern data, the blanking aperture array control section 86 defines an opening through which an electron beam should pass and executes power control for the deflection electrode formed in each opening. As the wafer 44 moves, the opening through which the electron beam should pass is appropriately changed. In addition, the electron beam is deflected by the main deflecting section 42 and sub-deflecting section 38. With this operation, a desired circuit pattern can be exposed to the wafer 44.

In the first to fourth embodiments below, the structure and manufacturing method of the blanking aperture array device 26 will be described. The same structure and manufacturing method can also be applied to the deflectors of the first shaping deflecting section 18, second shaping deflecting section 20, and sub-deflecting section 38.

Figure 2:
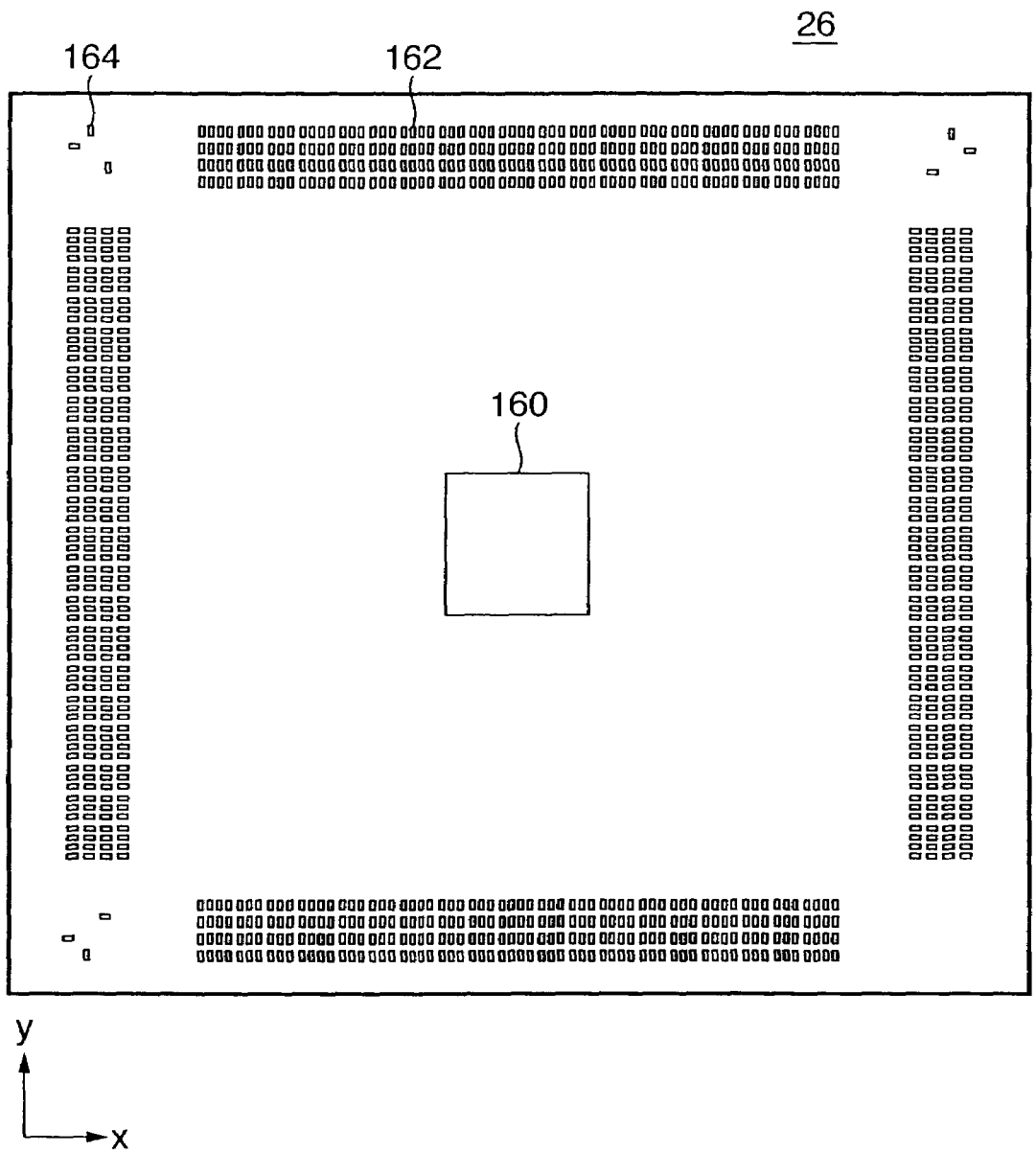
FIG. 2 is a view showing the structure of a blanking aperture array device 26.

FIG. 2 shows the structure of the blanking aperture array device 26. The blanking aperture array device 26 has an aperture portion 160 having a plurality of openings through which electron beams pass, and the deflection electrode pad 162 and ground electrode pad 164, which serve as connection portions to the blanking aperture array control section 86 shown in FIG. 1. The aperture portion 160 is preferably located at the central portion of the blanking aperture array device 26. The deflection electrode pad 162 and ground electrode pad 164 supply an electric signal supplied from the blanking aperture array control section 86 through a probe card and pogo-pin array to the deflection electrodes formed in the openings of the aperture portion 160.

Figure 3:
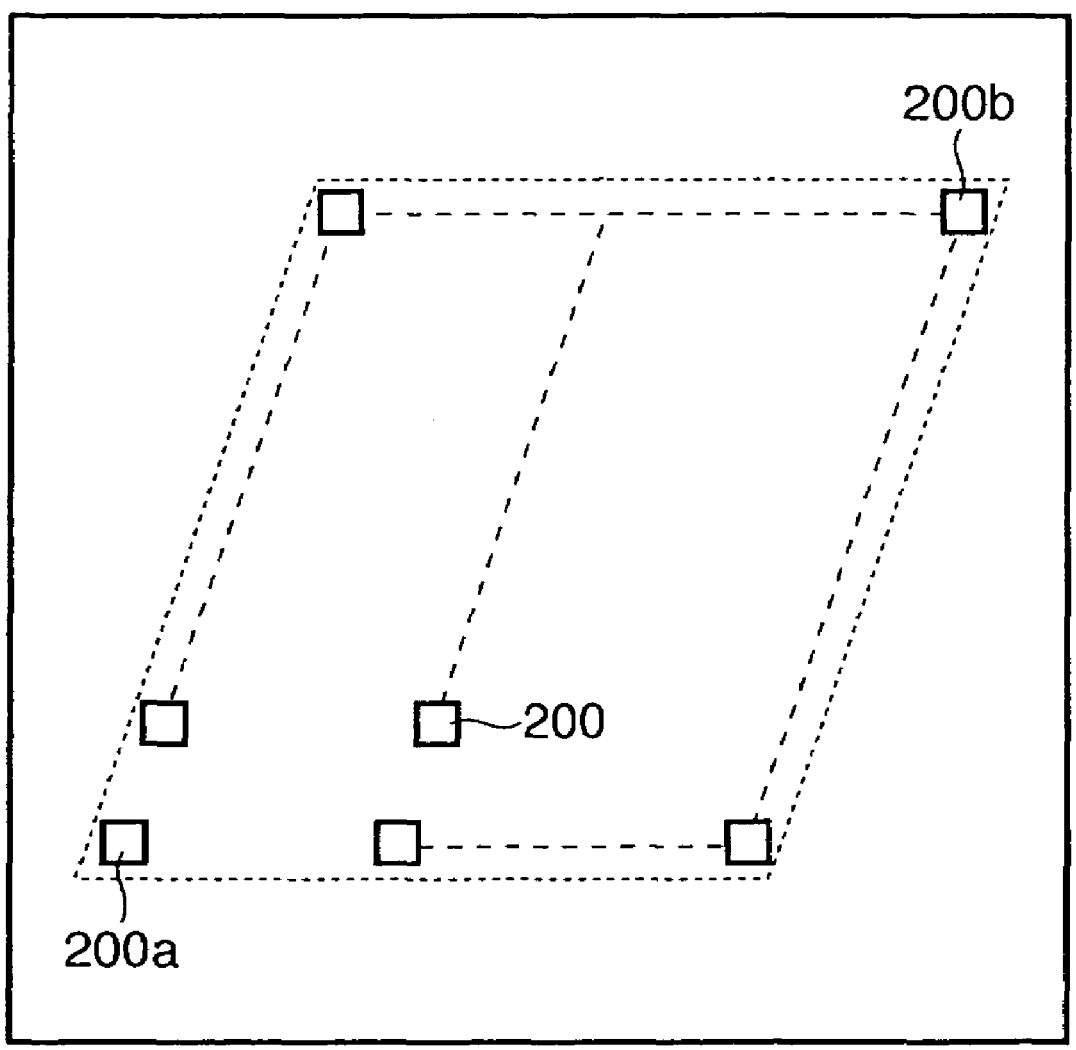
FIG. 3 is a view showing the structure of an aperture portion 160.

FIG. 3 shows the structure of the aperture portion 160. An X-axis direction is defined in the lateral direction of the aperture portion 160. A Y-axis direction is defined in the vertical direction. The X-axis indicates the direction in which the wafer stage 46 moves the wafer 44 stepwise during exposure processing. The Y-axis indicates the direction in which the wafer stage 46 moves the wafer 44 continuously during exposure processing. More specifically, the Y-axis indicates the scanning/exposure direction of the wafer 44 with respect to the wafer stage 46. The X-axis indicates the direction in which the wafer 44 is moved stepwise to exposure unexposed regions of the wafer 44 after the end of scanning/exposure.

The aperture portion 160 has openings 200 through which the plurality of electron beams should pass. The plurality of openings 200 are laid out to expose the entire scanning region. For example, the plurality of openings 200 are laid out to cover the whole region between a plurality of openings 200a and 200b which are located at two ends in the X-axis direction. The openings 200 close in the X-axis direction are preferably laid out at a predetermined interval. The interval between the plurality of openings 200 is preferably defined to be equal to or smaller than the maximum deflection amount of electron beam deflection by the main deflecting section 42.

Figure 4A:
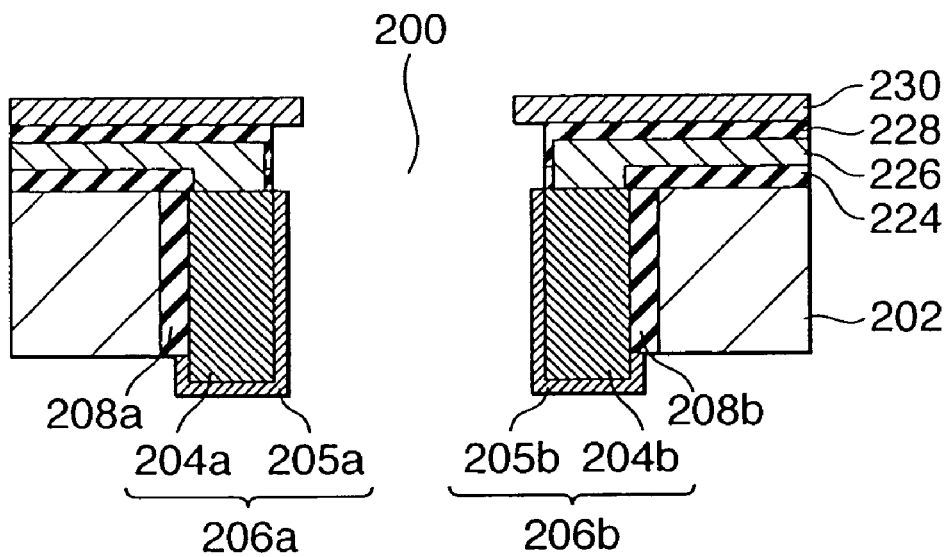
FIGS. 4A and 4B are views showing an example of the detailed structure of the blanking aperture array device 26 according to the first embodiment.
Figure 4B:
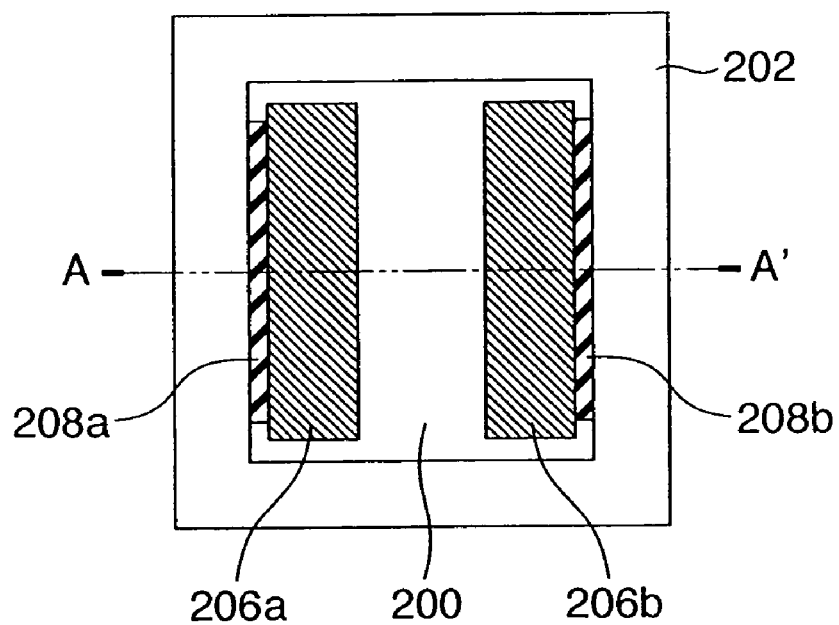

FIGS. 4A and 4B show an example of the detailed structure of the blanking aperture array device 26 according to the first embodiment. FIG. 4B is a plan view. FIG. 4A is a sectional view taken along a line A–A'. The blanking aperture array device 26 comprises a substrate 202 having the openings 200 through which electron beams should pass, deflection electrodes 206a and 206b that oppose each other in each opening 200 to deflect an electron beam, insulating layers 208a and 208b arranged between the substrate 202 and the deflection electrode 206a and between the substrate 202 and the deflection electrode 206b, respectively, an insulating layer 224 formed on the upper surface of the substrate 202, an interconnection layer 226 formed on the upper surface of the insulating layer 224, an insulating layer 228 formed on the upper surface of the interconnection layer 226, and a conductive film 230 formed on the upper surface of the insulating layer 228.

The insulating layers 208a and 208b electrically insulate the deflection electrodes 206a and 206b from the substrate 202. The insulating layer 224 electrically insulates the substrate 202 from the interconnection layer 226. The insulating layer 228 electrically insulates the interconnection layer 226 from the conductive film 230. The conductive film 230 is electrically connected to the ground electrode pad 164 shown in FIG. 2 and thus grounded. The conductive film 230 functions as an anti-charge-up metal layer for the insulating layer 228. The deflection electrodes 206a and 206b are electrically connected to the deflection electrode pad 162 shown in FIG. 2 through the interconnection layer 226.

The deflection electrode 206a has a conductive member 204a and a conductive member 205a formed on the surface of the conductive member 204a. The deflection electrode 206b has a conductive member 204b and a conductive member 205b formed on the surface of the conductive member 204b. The conductive members 205a and 205b are preferably made of a material that is more difficult to oxidize than the conductive members 204a and 204b. The conductive members 204a and 204b are preferably made of a material having a higher plating growth rate than the conductive members 205a and 205b. The conductive members 204a and 204b are preferably made of a material whose residual stress after plating growth is smaller than the conductive members 205a and 205b. The conductive members 204a and 204b and conductive members 205a and 205b are preferably made of materials having high ionization tendency. For example, the conductive members 204a and 204b are made of Cu while the conductive members 205a and 205b are made of Au. The conductive members 204a and 204b may be made of a copper alloy containing a trace quantity of Be in Cu. The conductive members 205a and 205b may be made of a gold alloy containing a trace quantity of Ag or Pt in Au.

The substrate 202 is, e.g., a silicon substrate. The insulating layers 208a and 208b are oxide films formed by thermally oxidizing the substrate 202 and, for example, silicon oxide films formed by thermally oxidizing a silicon substrate.

According to the blanking aperture array device 26 of this embodiment, the conductive members 205a and 205b which are difficult to oxidize are formed as the peripheral portions of the deflection electrodes 206a and 206b. The deflection electrodes 206a and 206b are bonded to the insulating layers 208a and 208b through the conductive members 204a and 204b with small residual stress. For this reason, degradation of the deflection electrodes 206a and 206b due to oxidization can be prevented while maintaining the bonding strength. Hence, the blanking aperture array device 26 with a long service life can be provided.

Figure 5:
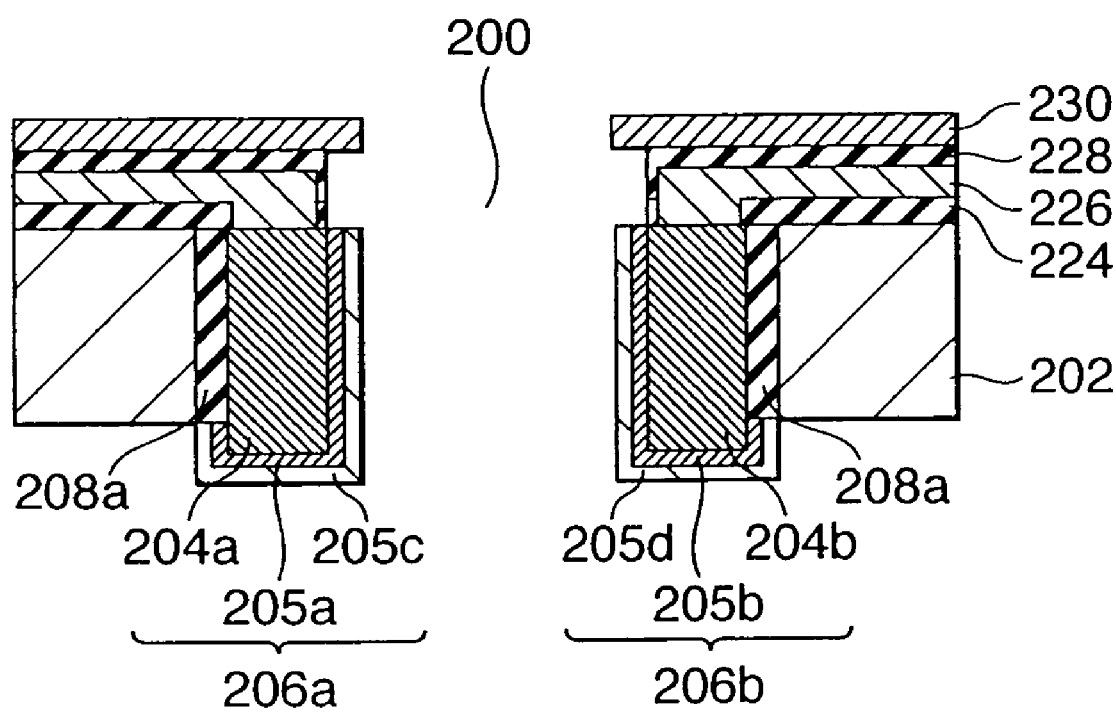
FIG. 5 is a view showing another example of the detailed structure of the blanking aperture array device 26 according to the first embodiment.

FIG. 5 shows another example of the detailed structure of the blanking aperture array device 26 according to the first embodiment. The structure of the blanking aperture array device 26 shown in FIG. 5 is the same as in FIG. 4 except the following description. The deflection electrode 206a also has a conductive member 205c formed on the surface of the conductive member 205a. The deflection electrode 206b also has a conductive member 205d formed on the surface of the conductive member 205b. The conductive members 205c and 205d are preferably made of a material that is more difficult to oxidize than the conductive members 205a and 205b. The conductive members 205c and 205d are preferably made of a material having a lower plating growth rate than the conductive members 205a and 205b. The conductive members 205c and 205d are preferably made of a material whose residual stress after plating growth is larger than the conductive members 205a and 205b.

Figure 6A:
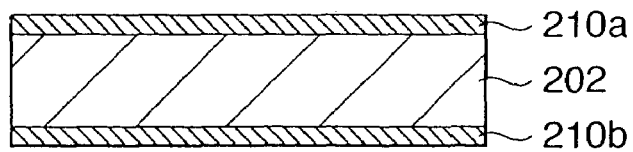
FIGS. 6A to 6O are views showing a method of manufacturing the blanking aperture array device 26 according to the first embodiment.
Figure 6B:
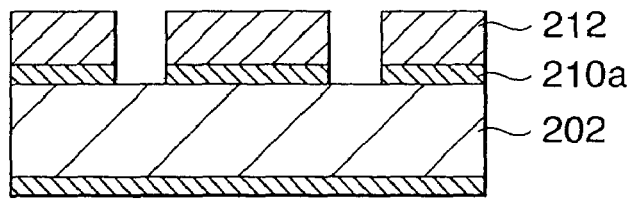
Figure 6C:
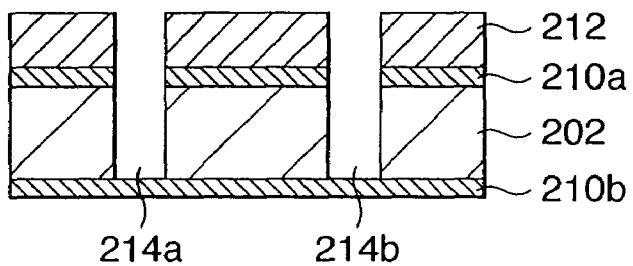
Figure 6D:
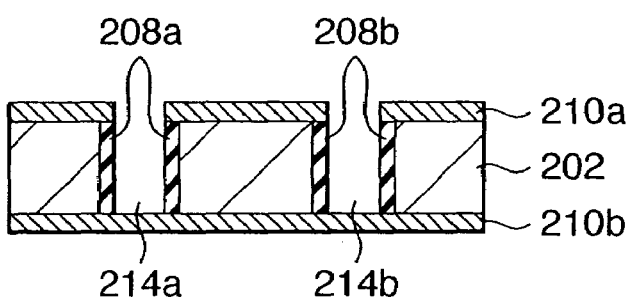
Figure 6E:
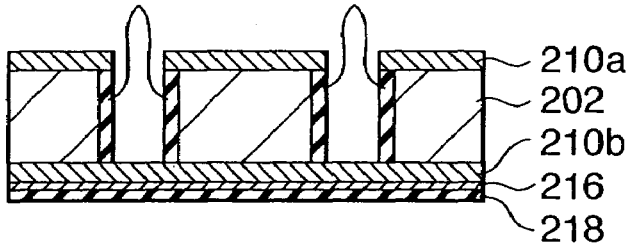
Figure 6F:
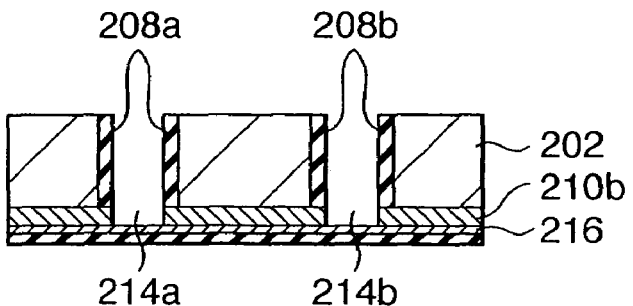
Figure 6G:
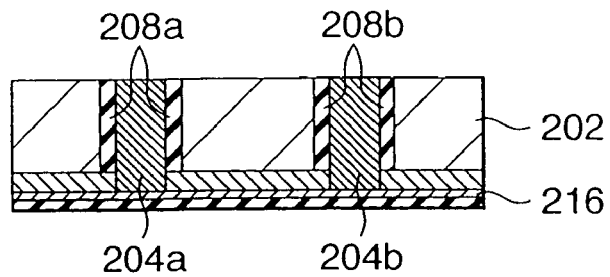
Figure 6H:
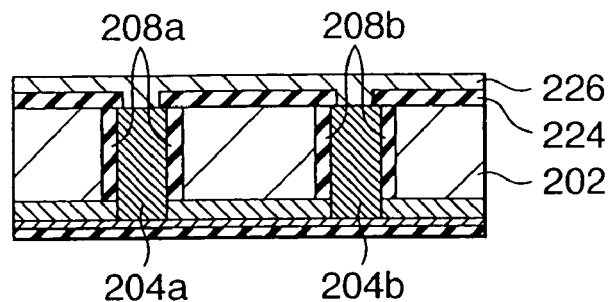
Figure 6I:
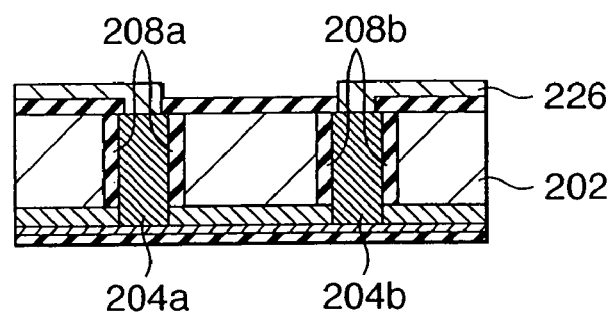
Figure 6J:
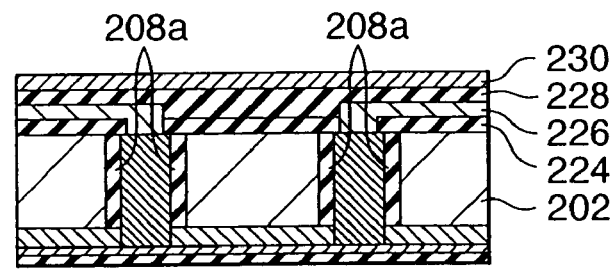
Figure 6K:
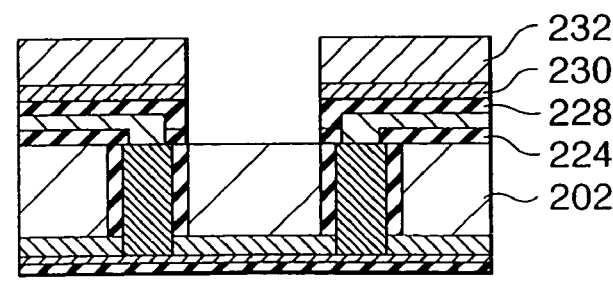
Figure 6L:
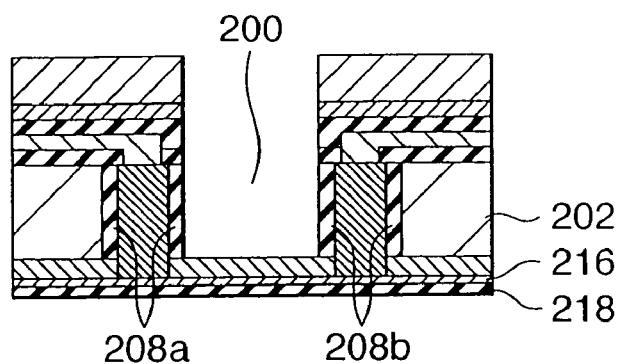
Figure 6M:
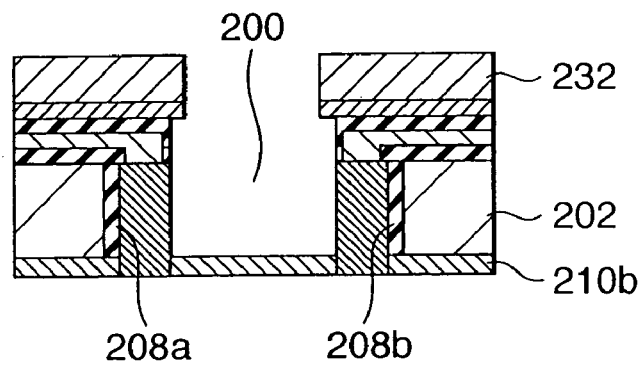
Figure 6N:
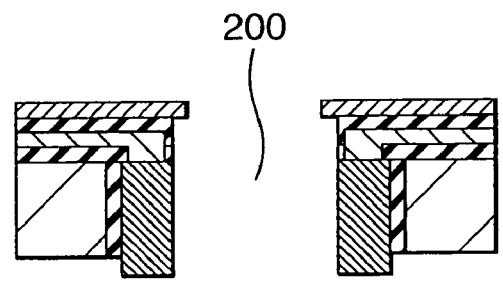
Figure 6O:
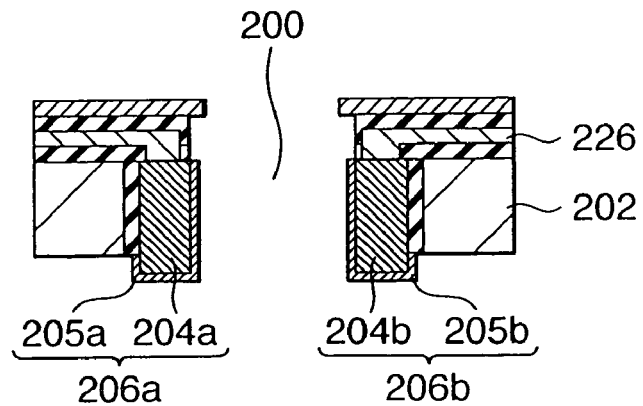

FIGS. 6A to 6O show a method of manufacturing the blanking aperture array device 26. First, as shown in FIG. 6A, the substrate 202 is prepared. Silicon nitride films 210a and 210b are formed on the upper and lower surfaces of the substrate 202, respectively. The silicon nitride films 210a and 210b may be formed either simultaneously or separately. The substrate 202 is a silicon wafer having, e.g., a diameter of 6 inches and a thickness of 200 μm. Each of the silicon nitride films 210a and 210b has a thickness of, e.g., 1 μm.

Next, as shown in FIG. 6B, a resist 212 is applied to the upper surface of the silicon nitride film 210a. Exposure and development are performed, and the resist 212 is removed from regions where the conductive members 204a and 204b are to be formed. The silicon nitride film 210a in the regions where the conductive members 204a and 204b are to be formed is removed by etching such as reactive ion etching (RIE) using the resist 212 as an etching mask.

As shown in FIG. 6C, the substrate 202 at the portions where the conductive members 204a and 204b are to be formed is removed by etching such as inductively coupled plasma etching (ICP-RIE) using both or one of the resist 212 and silicon nitride film 210a as an etching mask, thereby forming a plurality of openings 214a and 214b. The silicon nitride film 210b serves as an etching stopper layer in etching the substrate 202.

As shown in FIG. 6D, the resist 212 is removed. After that, the insulating layers 208a and 208b are formed on the inner walls of the plurality of openings 214a and 214b formed in the substrate 202. The insulating layers 208a and 208b are formed by, e.g., thermally oxidizing the inner walls of the plurality of openings 214a and 214b. More specifically, of the inner walls of the plurality of openings 214a and 214b formed in the substrate 202 as a silicon substrate, silicon exposed surfaces except portions covered with the silicon nitride films 210a and 210b are selectively thermally oxidized, thereby forming the insulating layers 208a and 208b as silicon oxide films.

As shown in FIG. 6E, a conductive film 216 is formed on the silicon nitride film 210b. An insulating layer 218 is formed on the conductive film 216. More specifically, a 50-nm thick Cr film, a 200-nm thick Au film, and a 50-nm thick Cr film are formed in this order by e.g. EB deposition to form the conductive film 216 having a multilayered structure of Cr/Au/Cr. When the multilayered structure of Cr/Au/Cr is formed as the conductive film 216, the adhesion between the silicon nitride film 210b and the conductive film 216 can be increased. If the adhesion between the silicon nitride film 210b and the conductive film 216 has no problem, the conductive film 216 may be, e.g., an Au film having a single-layered structure. The insulating layer 218 made of a silicon oxide film is formed on the conductive film 216 by e.g. plasma chemical vapor deposition (CVD). The silicon nitride film 210b formed in FIG. 6A is used to electrically insulate the substrate 202 from the conductive film 216.

As shown in FIG. 6F, the silicon nitride film 210a and the portions of the silicon nitride film 210b, which are exposed to the plurality of openings 214a and 214b, are selectively removed by, e.g., RIE. At this time, without removing the insulating layers 208a and 208b formed on the sidewalls of the openings 214a and 214b, the silicon nitride film 210b is etched until the conductive film 216 is exposed to the openings 214a and 214b. In addition, the Cr film of the conductive film 216 is etched until the Au film is exposed. Tn another example, without removing the insulating layers 208a and 208b formed on the sidewalls of the openings 214a and 214b, the silicon nitride film 210a and the portions of the silicon nitride film 210b, which are exposed to the plurality of openings 214a and 214b, may be removed by wet etching using hot phosphoric acid. After that, the Cr film of the conductive film 216 may be removed by etching in the same way.

As shown in FIG. 6G, the conductive members 204a and 204b are formed by selectively executing electrolytic plating in the plurality of openings 214a and 214b by using the Au film of the conductive film 216 as a plating electrode (seed layer). The conductive members 204a and 204b are made of, e.g., Cu. After the conductive members 204a and 204b are formed, the conductive members 204a and 204b formed outside the openings 214a and 214b are removed by, e.g., chemical mechanical polishing (CMP). In another example, after Cr films are formed on the surfaces of the insulating layers 208a and 208b exposed to the plurality of openings 214a and 214b by sputtering, the conductive members 204a and 204b may be formed inside the Cr films in the plurality of openings 214a and 214b. With this structure, the adhesion between the conductive members 204a and 204b and the insulating layers 208a and 208b can be increased.

As shown in FIG. 6H, an insulating layer 224 and interconnection layer 226 are formed on the substrate 202. More specifically, the insulating layer 224 as a silicon oxide film having a thickness of about 1 μm is formed by e.g. plasma CVD. A resist is applied to the surface of the insulating layer 224. Exposure and development are performed, and the resist above the conductive members 204a and 204b is removed. The insulating layer 224 is removed by etching such as RIE using the resist as an etching mask. After the resist is removed, a Cr film and Au film are deposited on the surface of the insulating layer 224 in this order by sputtering, thereby forming the interconnection layer 226 electrically connected to the conductive members 204a and 204b.

As shown in FIG. 6I, an interconnection pattern is formed on the interconnection layer 226. More specifically, a resist is applied to the surface of the interconnection layer 226. Exposure and development are performed, and the resist is removed from a region where no interconnection is to be formed. The interconnection layer 226 is removed by etching such as RIE using the resist as an etching mask, thereby forming the interconnection pattern. Then, the resist is removed.

As shown in FIG. 6J, an insulating layer 228 and conductive film 230 are formed on the insulating layer 224 and interconnection layer 226. More specifically; the insulating layer 228 as a silicon oxide film having a thickness of about 1 μm is formed by e.g. plasma CVD. A Cr film and Au film are deposited on the surface of the insulating layer 228 in this order by sputtering to form the conductive film 230.

As shown in FIG. 6K, a resist 232 is applied to the surface of the conductive film 230. Exposure and development are performed, and the resist 232 is removed from a region where the opening 200 through which an electron beam should pass is to be formed. Using the resist 232 as an etching mask, the conductive film 230 is removed by etching such as ion milling, and the insulating layers 224 and 228 are removed by etching such as RIE.

As shown in FIG. 6L, the substrate 202 is removed by etching such as ICP-RIE using the resist 232 as an etching mask.

As shown in FIG. 6M, the portions of the insulating layers 208a and 208b, which are exposed to the opening 200, the insulating layer 218, and the conductive film 216 are removed by etching. More specifically, while leaving the resist 232, the insulating layers 208a and 208b as silicon oxide films on the sidewall of the opening 200 are removed by wet etching using a solution mixture of, e.g., HF and $NH_4F$. Simultaneously, the insulating layer 218 is also removed by wet etching. The Cr film of the conductive film 216 is removed by wet etching using a solution mixture of, e.g., cerium ammonium nitrate (IV), perchloric acid, and water. The Au film of the conductive film 216 is removed by wet etching using a solution mixture of, e.g., potassium iodide, iodine, and water.

As shown in FIG. 6N, after the resist 232 is removed, the silicon nitride film 210b is removed by etching. More specifically, the silicon nitride film 210b is removed by wet etching using, e.g., hot phosphoric acid to make the opening 200 through.

As shown in FIG. 6O, the conductive members 205a and 205b are formed on the surfaces of the conductive members 204a and 204b. For example, power is supplied from the interconnection layer 226 to the conductive members 204a and 204b by using the interconnection layer 226 as a plating electrode so that the conductive members 205a and 205b are formed on the surfaces of the conductive members 204a and 204b by electrolytic plating. More specifically, the conductive members 205a and 205b are made of Au. In another example, the surfaces of the conductive members 204a and 204b may be subjected to activation processing, and the conductive members 205a and 205b may be formed on the surfaces of the conductive members 204a and 204b by electroless plating such as chemical plating or displacement plating. More specifically, the surfaces of the conductive members 204a and 204b made of Cu are subjected to activation processing by acid treatment using an acid except hydrofluoric acid and degreasing cleaning, thereby activating (ionizing) only the surfaces of the conductive members 204a and 204b. Then, using a plating solution containing Au, Au is immersion plating on the surfaces of the conductive members 204a and 204b having high ionization tendency, thereby forming the conductive members 205a and 205b.

If the conductive members 205c and 205d are also to be formed, as shown in FIG. 5, the same procedures as in formation of the conductive members 205a and 205b are used.

In this embodiment, the lower surface of the substrate 202 is exposed. However, a conductive film may be formed on the lower surface of the substrate 202 to prevent the substrate 202 from being charged up. In the above way, the blanking aperture array device 26 is completed by the manufacturing method shown in FIGS. 6A to 6O.

According to the blanking aperture array device 26 of this embodiment, even when the deflection electrodes 206a and 206b are formed in the openings 214a and 214b having a high aspect ratio, the time required for manufacturing the blanking aperture array device 26 can be shortened because most portions of the deflection electrodes 206a and 206b are formed by the conductive members 204a and 204b having a high plating growth rate. In addition, the peripheral portions of the deflection electrodes 206a and 206b are formed from the conductive members 205a and 205b which are difficult to oxidize. For this reason, degradation of the deflection electrodes 206a and 206b due to oxidization can be prevented. Hence, the reliability of electron beam deflection by the blanking aperture array device 26 can be increased. In addition, the service life of the blanking aperture array device 26 can be prolonged.

[Second Embodiment]

The second embodiment will be described next. The arrangement of an electron beam exposure apparatus 100, the structure of a blanking aperture array device 26, and the structure of an aperture portion 160 are the same as in the first embodiment (FIGS. 1 to 3).

Figure 7:
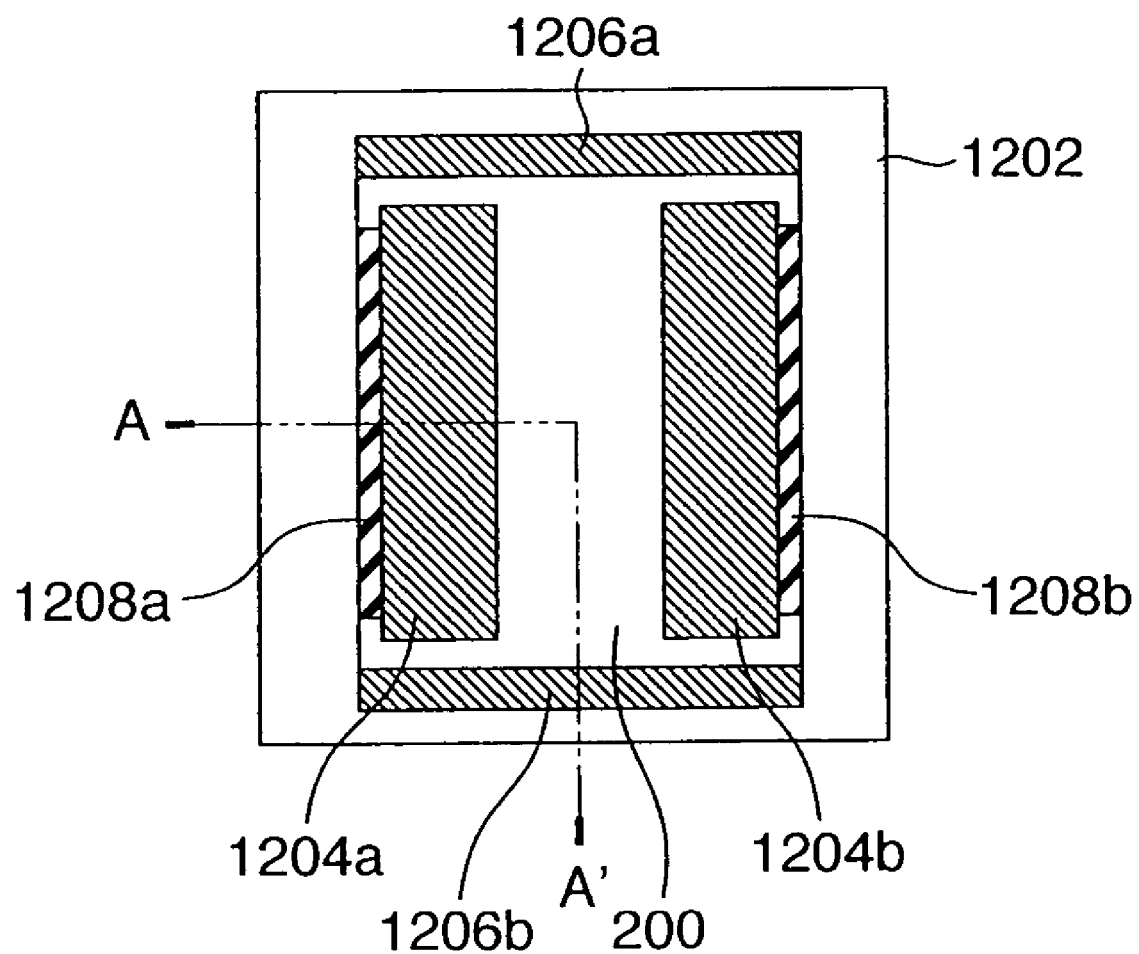
FIG. 7 is a view showing an example of the detailed structure of a blanking aperture array device 26 according to the second embodiment.

FIG. 7 shows the detailed structure of the blanking aperture array device 26 according to the second embodiment. FIG. 7 is a plan view of the blanking aperture array device 26 viewed from the lower surface.

The blanking aperture array device 26 comprises a substrate 1202 having an opening 200 through which an electron beam should pass, deflection electrodes 1204a and 1204b that oppose each other in the opening 200 to deflect an electron beam, conductive layers 1206a and 1206b which are formed almost perpendicularly to the direction from the deflection electrode 1204a to the deflection electrode 1204b while opposing each other in the opening 200, and insulating layers 1208a and 1208b formed between the substrate 1202 and the deflection electrode 1204a and between the substrate 1202 and the deflection electrode 1204b, respectively.

The conductive layers 1206a and 1206b are electrically connected to a ground electrode pad 164 shown in FIG. 2 and thus grounded. The conductive layers 1206a and 1206b may be connected to the ground electrode pad 164 either directly or via the substrate 1202.

The conductive layers 1206a and 1206b are preferably made of a material having a high conductivity than the substrate 1202. The conductive layers 1206a and 1206b are preferably formed by metal plating. The substrate 1202 is, e.g., a silicon substrate. The conductive layers 1206a and 1206b are made of, e.g., a material containing Au or Cu as a principal component.

The insulating layers 1208a and 1208b are oxide films formed by thermally oxidizing the substrate 1202 and, for example, silicon oxide films formed by thermally oxidizing a silicon substrate. In the direction almost perpendicular to the direction from the deflection electrode 1204a to the deflection electrode 1204b and the electron beam irradiation direction, the length of each of the insulating layers 1208a and 1208b is preferably smaller than the length of each of the deflection electrodes 1204a and 1204b. That is, the insulating layers 1208a and 1208b are shielded from the path of an electron beam by the deflection electrodes 1204a and 1204b. Hence, the insulating layers 1208a and 1208b can be prevented from being charged up.

The interval between the deflection electrode 1204a and the deflection electrode 1204b is preferably smaller than the interval between the conductive layer 1206a and the conductive layer 1206b. The conductive layers 1206a and 1206b may be thinner than the deflection electrodes 1204a and 1204b. More specifically, the deflection electrodes 1204a and 1204b are formed at an interval of several ten μm.

When the interval between the deflection electrode 1204a and the deflection electrode 1204b is small, the electron beam can be accurately deflected. In addition, the voltage applied to the deflection electrodes 1204a and 1204b can be made low.

According to the blanking aperture array device 26 of this embodiment, since the conductive layers 1206a and 1206b are formed on the inner wall of the opening 200, native oxidation of the substrate 1202 can be prevented. Since any native oxide film such as a silicon oxide film that affects the electron beam upon being charged up is not formed on the inner surface of the opening 200, the electron beam can be accurately deflected.

Figure 8:
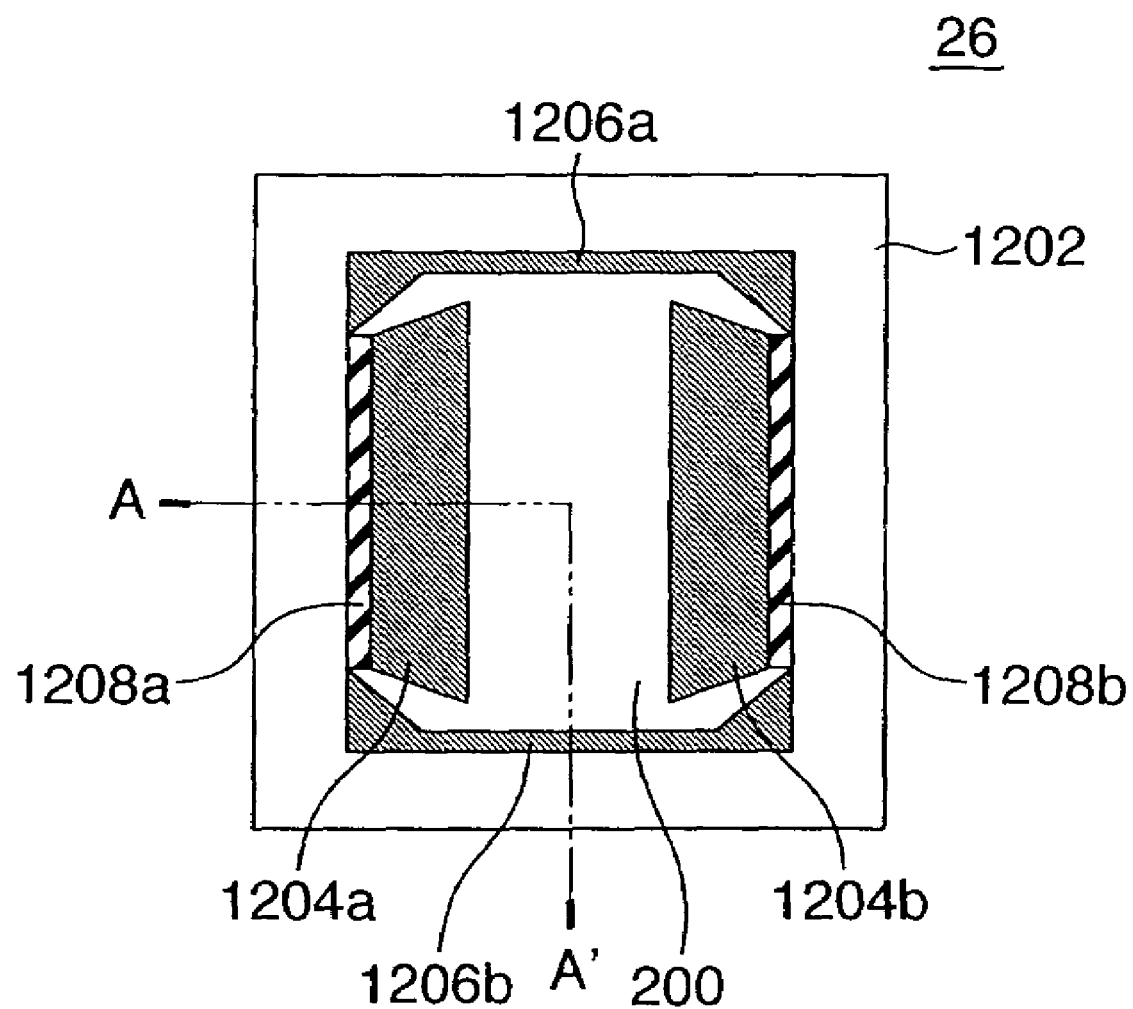
FIG. 8 is a view showing another example of the detailed structure of the blanking aperture array device 26 according to the second embodiment.

FIG. 8 shows a modification of the detailed structure of the blanking aperture array device 26 according to the second embodiment. FIG. 8 is a plan view of the blanking aperture array device 26 viewed from the lower surface. The same reference numerals as in the blanking aperture array device 26 (FIG. 7) according to the second embodiment denote the same constituent elements in FIG. 8, and a description thereof will be simplified or omitted. Different portions will be described in detail.

The conductive layers 1206a and 1206b are formed from a position adjacent to the insulating layer 1208a to a position adjacent to the insulating layer 1208b. More specifically, the conductive layers 1206a and 1206b are formed on the inner wall of the opening 200 from a surface on which the deflection electrode 1204a is formed to a surface on which the deflection electrode 1204b is formed. The conductive layers 1206a and 1206b are also formed from the upper end to the lower end of the opening 200 not to make the substrate 1202 expose into the opening 200. In this case, the conductive layers 1206a and 1206b and the deflection electrodes 1204a and 1204b are formed not to come into contact with each other.

More specifically, in each of the deflection electrodes 1204a and 1204b, the surface that opposes the other deflection electrode, i.e., the area of the surface that opposes the electron beam is preferably larger than the area of the surface that opposes the substrate 202, i.e., the area of the surface that is in contact with a corresponding one of the insulating layers 1208a and 1208b. For example, each of the deflection electrodes 1204a and 1204b has a trapezoidal columnar shape that is tapered along a direction from the center of the opening 200, i.e., the position at which the electron beam should pass, to the inner wall of the opening 200. In addition, in the direction almost perpendicular to the direction from the deflection electrode 1204a to the deflection electrode 1204b, the width of the surface of each of the deflection electrodes 1204a and 1204b, which opposes the substrate 1202, may be equal to or more than the width of each of the insulating layers 1208a and 1208b.

According to the blanking aperture array device 26 of this embodiment, the conductive layers 1206a and 1206b are formed to cover the inner wall of the opening 200. For this reason, the influence of the charged-up substrate 1202 on the electron beam can be greatly reduced. Accordingly, the electron beam can be accurately deflected.

Figure 9A:
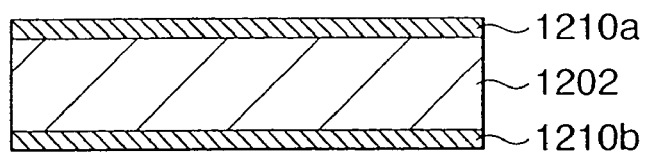
FIGS. 9A to 9P are views showing a method of manufacturing the blanking aperture array device 26 according to the second embodiment.
Figure 9B:
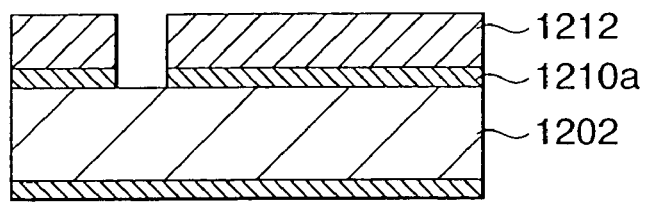
Figure 9C:
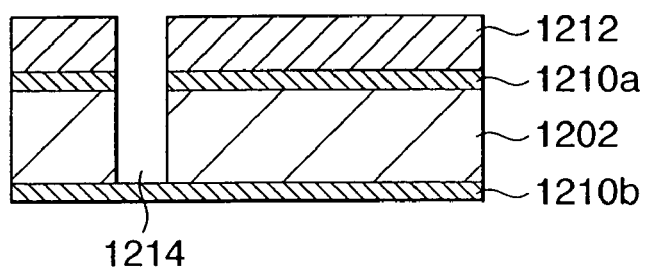
Figure 9D:
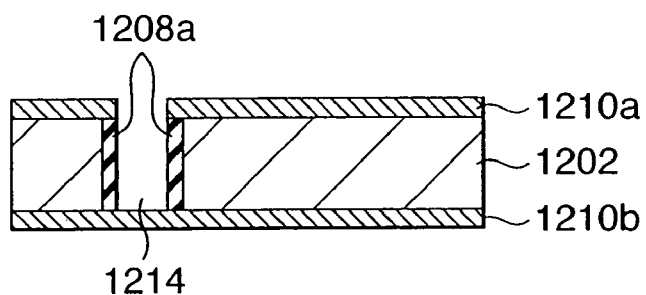
Figure 9E:
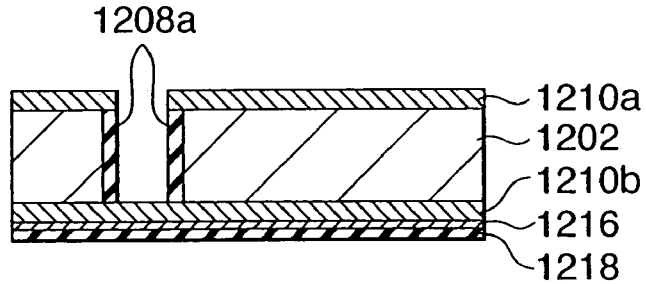
Figure 9F:
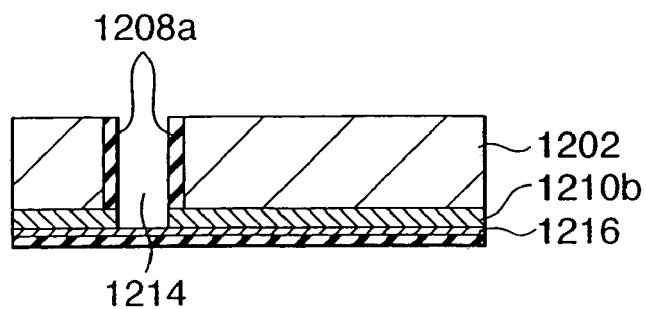
Figure 9G:
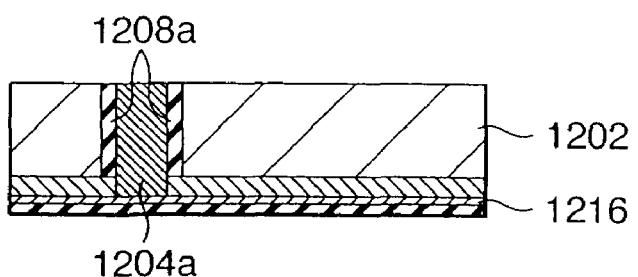
Figure 9H:
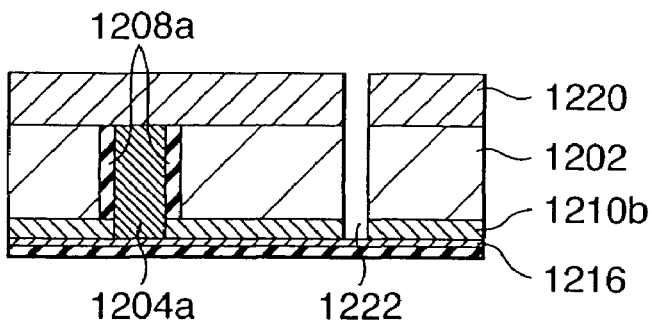
Figure 9I:
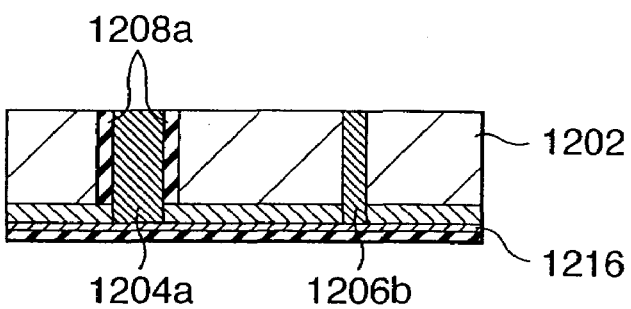
Figure 9J:
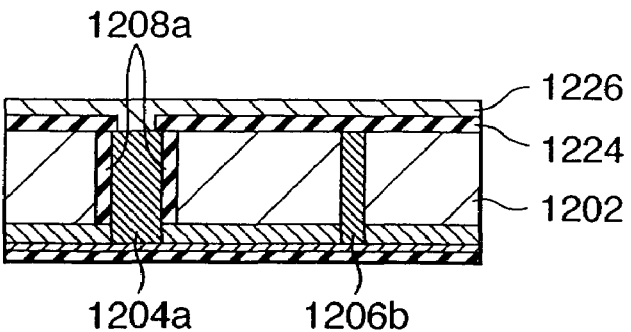
Figure 9K:
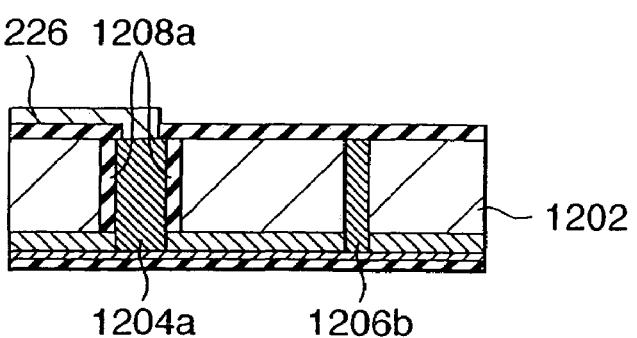
Figure 9L:
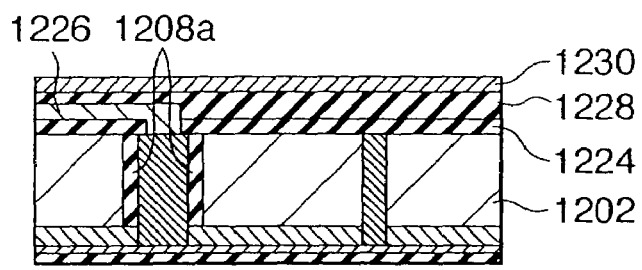
Figure 9M:
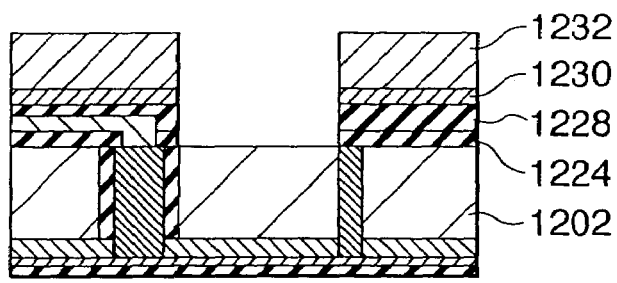
Figure 9N:
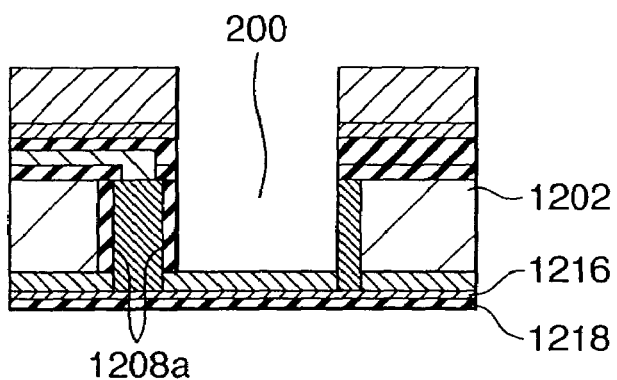
Figure 9O:
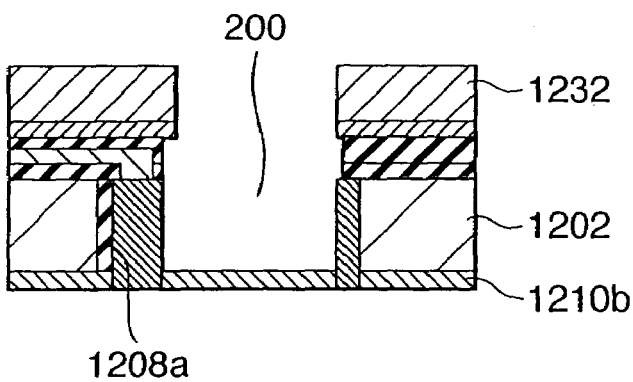
Figure 9P:
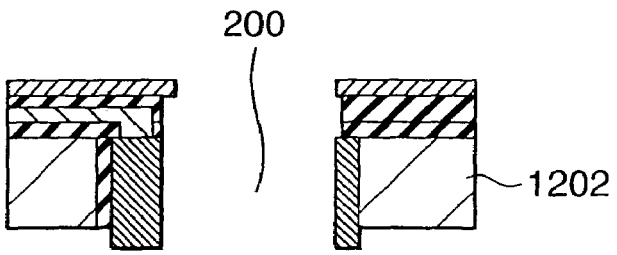

FIGS. 9A to 9P show a method of manufacturing the blanking aperture array device 26 according to the second embodiment shown in FIG. 7 or its modification shown in FIG. 8. FIGS. 9A to 9P are sectional views of the blanking aperture array device 26 taken along a line A–A' in FIG. 7 or 8.

First, as shown in FIG. 9A, the substrate 1202 is prepared. Silicon nitride films 1210a and 1210b are formed on the upper and lower surfaces of the substrate 1202, respectively.

The silicon nitride films 1210a and 1210b may be formed either simultaneously or separately. The substrate 1202 is a silicon wafer having, e.g., a diameter of 6 inches and a thickness of 200 $\mu$m. Each of the silicon nitride films 1210a and 1210b has a thickness of, e.g., 1 $\mu$m.

Next, as shown in FIG. 9B, a resist 1212 is applied to the upper surface of the silicon nitride film 1210a. Exposure and development are performed, and the resist 1212 is removed from regions where the deflection electrodes 1204a and 1204b are to be formed. The silicon nitride film 1210a in the regions where the deflection electrodes 1204a and 1204b are to be formed is removed by etching such as reactive ion etching (RIE) using the resist 1212 as an etching mask.

As shown in FIG. 9C, the substrate 1202 at the portions where the deflection electrodes 1204a and 1204b are to be formed is removed by etching such as inductively coupled plasma etching (ICP-RIE) using both or one of the resist 1212 and silicon nitride film 1210a as an etching mask, thereby forming a plurality of openings 1214. The silicon nitride film 1210b serves as an etching stopper layer in etching the substrate 1202.

As shown in FIG. 9D, the resist 1212 is removed. After that, the insulating layers 1208a and 1208b are formed on the inner walls of the plurality of openings 1214 formed in the substrate 1202. The insulating layers 1208a and 1208b are formed by, e.g., thermally oxidizing the inner walls of the plurality of openings 1214. More specifically, of the inner walls of the plurality of openings 1214 formed in the substrate 1202 as a silicon substrate, silicon exposed surfaces except portions covered with the silicon nitride films 1210a and 1210b are selectively thermally oxidized, thereby forming the insulating layers 1208a and 1208b as silicon oxide films.

As shown in FIG. 9E, a conductive film 1216 is formed on the silicon nitride film 1210b. An insulating layer 1218 is formed on the conductive film 1216. More specifically, a 50-nm thick Cr film, a 200-nm thick Au film, and a 50-nm thick Cr film are formed in this order by e.g. EB deposition to form the conductive film 1216 having a multilayered structure of Cr/Au/Cr. When the multilayered structure of Cr/Au/Cr is formed as the conductive film 1216, the adhesion between the silicon nitride film 1210b and the conductive film 1216 can be increased. If the adhesion between the silicon nitride film 1210b and the conductive film 1216 has no problem, the conductive film 1216 may be, e.g., an Au film having a single-layered structure. The insulating layer 1218 made of a silicon oxide film is formed on the conductive film 1216 by e.g. plasma chemical vapor deposition (CVD). The silicon nitride film 1210b formed in FIG. 9A is used to electrically insulate the substrate 1202 from the conductive film 1216.

As shown in FIG. 9F, the silicon nitride film 1210a and the portions of the silicon nitride film 1210b, which are exposed to the plurality of openings 1214, are selectively removed by, e.g., RIE. At this time, without removing the insulating layers 1208a and 1208b formed on the sidewalls of the plurality of openings 1214, the silicon nitride film 1210b is etched until the conductive film 1216 is exposed to the plurality of openings 1214. In addition, the Cr film of the conductive film 1216 is etched until the Au film is exposed. In another example, without removing the insulating layers 1208a and 1208b formed on the sidewalls of the plurality of openings 1214, the silicon nitride film 1210a and the portions of the silicon nitride film 1210b, which are exposed to the plurality of openings 1214, may be removed by wet etching using hot phosphoric acid. After that, the Cr film of the conductive film 1216 may be removed by etching in the same way.

As shown in FIG. 9G, the deflection electrodes 1204*a* and 1204*b* are formed by selectively executing electrolytic plating in the plurality of openings 1214 by using the Au film of the conductive film 1216 as a plating electrode (seed layer) and filling the openings 1214 with a conductive material. The deflection electrodes 1204*a* and 1204*b* are made of, e.g., Cu or Au. After the deflection electrodes 1204*a* and 1204*b* are formed, the conductive material of the deflection electrodes 1204*a* and 1204*b*, which is formed outside the openings 1214, is removed by, e.g., chemical mechanical polishing (CMP). In another example, after Cr films are formed on the surfaces of the insulating layers 1208*a* and 1208*b* exposed to the plurality of openings 1214 by sputtering, the interiors of the Cr films of the plurality of openings 1214 may be filled with the conductive material to form the deflection electrodes 1204*a* and 1204*b*. With this structure, the adhesion between the deflection electrodes 1204*a* and 1204*b* and the insulating layers 1208*a* and 1208*b* can be increased.

As shown in FIG. 9H, a resist 1220 is applied to the upper surface of the substrate 1202. Exposure and development are performed, and the resist 1220 is removed from regions where the conductive layers 1206*a* and 1206*b* are to be formed. The substrate 1202 at portions where the conductive layers 1206*a* and 1206*b* are to be formed is selectively removed by etching such as RIE using the resist 1220 as an etching mask, thereby forming openings 1222. Portions of the silicon nitride film 1210*b*, which are exposed to the openings 1222, are selectively removed by, e.g., RIE. In addition, the Cr film of the conductive film 1216 is etched until the Au film is exposed. In another example, the portions of the silicon nitride film 1210*b*, which are exposed to the openings 1222, and the Cr film of the conductive film 1216 may be removed by wet etching using hot phosphoric acid.

As shown in FIG. 9I, the conductive layers 1206*a* and 1206*b* are formed by selectively executing electrolytic plating in the openings 1222 by using the Au film of the conductive film 1216 as a plating electrode (seed layer) and filling the openings 1222 with a conductive material. The conductive layers 1206*a* and 1206*b* are made of, e.g., Cu. After the conductive layers 1206*a* and 1206*b* are formed, the resist 1220 is removed, and an unnecessary conductive material is removed by, e.g., CMP. In another example, after Cr films are formed on the surfaces of the substrate 1202 exposed to the openings 1222 by sputtering, the interiors of the Cr films of the openings 1222 may be filled with the conductive material to form the conductive layers 1206*a* and 1206*b*. With this structure, the adhesion between the conductive layers 1206*a* and 1206*b* and the substrate 1202 can be increased.

As shown in FIG. 9J, an insulating layer 1224 and interconnection layer 1226 are formed on the substrate 1202. More specifically, the insulating layer 1224 as a silicon oxide film having a thickness of about 1 μm is formed by e.g. plasma CVD. A resist is applied to the surface of the insulating layer 1224. Exposure and development are performed, and the resist above the deflection electrodes 1204*a* and 1204*b* is removed. The insulating layer 1224 is removed by etching such as RIE using the resist as an etching mask. After the resist is removed, a Cr film and Au film are deposited on the surface of the insulating layer 1224 in this order by sputtering, thereby forming the interconnection layer 1226.

As shown in FIG. 9K, an interconnection pattern is formed on the interconnection layer 1226. More specifically, a resist is applied to the surface of the interconnection layer 1226. Exposure and development are performed, and the resist is removed from a region where no interconnection is to be formed. The interconnection layer 1226 is removed by etching such as RIE using the resist as an etching mask thereby forming the interconnection pattern. Then, the resist is removed.

As shown in FIG. 9L, an insulating layer 1228 and conductive film 1230 are formed on the insulating layer 1224 and interconnection layer 1226. More specifically, the insulating layer 1228 as a silicon oxide film having a thickness of about 1 μm is formed by e.g. plasma CVD. A Cr film and Au film are deposited on the surface of the insulating layer 1228 in this order by sputtering to form the conductive film 1230. The conductive film 1230 is grounded and thus functions as an anti-charge-up metal layer for the insulating layer 1228.

As shown in FIG. 9M, a resist 1232 is applied to the surface of the conductive film 1230. Exposure and development are performed, and the resist 1232 is removed from a region where the opening 200 through which an electron beam should pass is to be formed. Using the resist 1232 as an etching mask, the conductive film 1230 is removed by etching such as ion milling, and the insulating layers 1224 and 1228 are removed by etching such as RIE.

As shown in FIG. 9N, the substrate 1202 is removed by etching such as ICP-RIE using the resist 1232 as an etching mask. At this time, the opening 200 having an I shape when viewed from the upper side is formed.

As shown in FIG. 9O, the portions of the insulating layers 1208*a* and 1208*b*, which are exposed to the opening 200, the insulating layer 1218, and the conductive film 1216 are removed by etching. More specifically, while leaving the resist 1232, the insulating layers 1208*a* and 1208*b* as silicon oxide films on the sidewall of the opening 200 are removed by wet etching using a solution mixture of, e.g., HF and NH$_4$F. Simultaneously, the insulating layer 1218 is also removed by wet etching. The Cr film of the conductive film 1216 is removed by wet etching using a solution mixture of, e.g., cerium ammonium nitrate (IV), perchloric acid, and water. The Au film of the conductive film 1216 is removed by wet etching using a solution mixture of, e.g., potassium iodide, iodine, and water.

As shown in FIG. 9P, after the resist 1232 is removed, the silicon nitride film 1210*b* is removed by etching. More specifically, the silicon nitride film 1210*b* is removed by wet etching using, e.g., hot phosphoric acid to make the opening 200 through. In this embodiment, the lower surface of the substrate 1202 is exposed. However, a conductive film may be formed on the lower surface of the substrate 1202 to prevent the substrate 1202 from being charged up. In the above way, the blanking aperture array device 26 is completed by the manufacturing method shown in FIGS. 9A to 9P.

According to the blanking aperture array devices 26 according to the second embodiment and its modification, since the conductive layers 1206*a* and 1206*b* are in contact with the substrate 1202, the conductive layers 1206*a* and 1206*b* can be grounded through the substrate 1202. Hence, no interconnection need be formed to ground the conductive layers 1206*a* and 1206*b*, and the interconnection density can be reduced.

[Third Embodiment]

Figure 10:
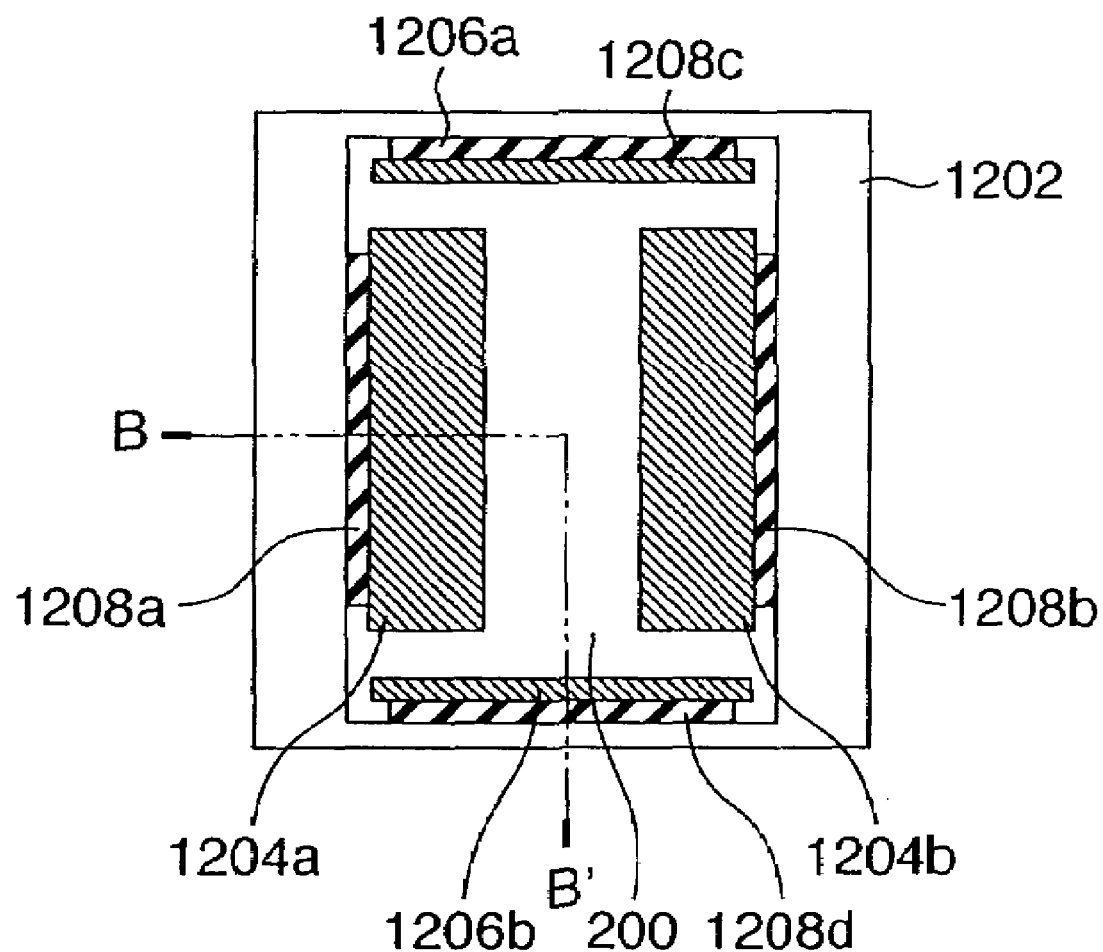
FIG. 10 is a view showing the detailed structure of a blanking aperture array device 26 according to the third embodiment.

FIG. 10 shows the detailed structure of a blanking aperture array device 26 according to the third embodiment. FIG. 10 is a plan view of the blanking aperture array device 26 viewed from the lower surface. The same reference numerals as in the blanking aperture array devices 26 according to the second embodiment and its modification denote the same constituent elements in the third embodiment, and a description thereof will be simplified or omitted. Different portions will be described in detail.

The blanking aperture array device 26 further comprises insulating layers 1208c and 1208d formed between a substrate 1202 and a conductive layer 1206a and between the substrate 1202 and a conductive layer 1206b. Insulating layers 1208a and 1208b and the insulating layers 1208c and 1208d can be made of the same material and have almost the same thickness.

Like the insulating layers 1208a and 1208b, the insulating layers 1208c and 1208d are oxide films formed by thermally oxidizing the substrate 1202 and, for example, silicon oxide films formed by thermally oxidizing a silicon substrate. In the direction from a deflection electrode 1204a to a deflection electrode 1204b, the width of each of the insulating layers 1208c and 1208d is preferably smaller than the width of each of the conductive layers 1206a and 1206b. That is, the insulating layers 1208c and 1208d are shielded from the path of an electron beam by the conductive layers 1206a and 1206b. Hence, the insulating layers 1208c and 1208d can be prevented from being charged up.

Figure 11A:
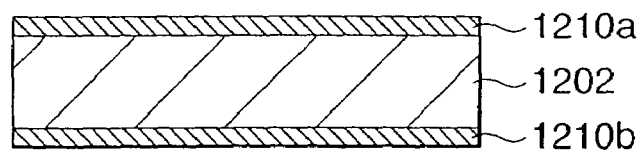
FIGS. 11A to 11N are views showing a method of manufacturing the blanking aperture array device 26 according to the third embodiment.
Figure 11B:
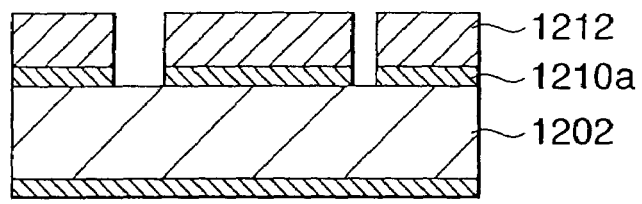
Figure 11C:
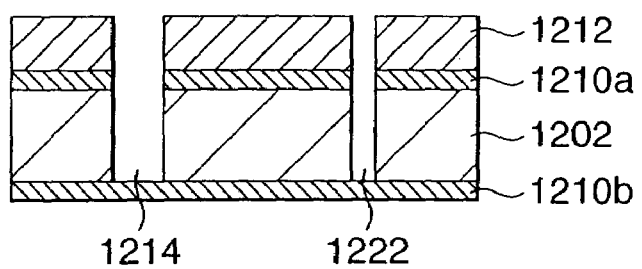
Figure 11D:
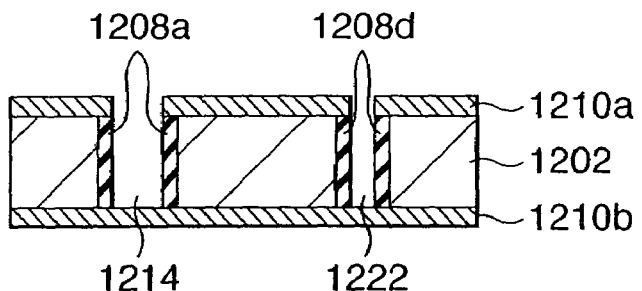
Figure 11E:
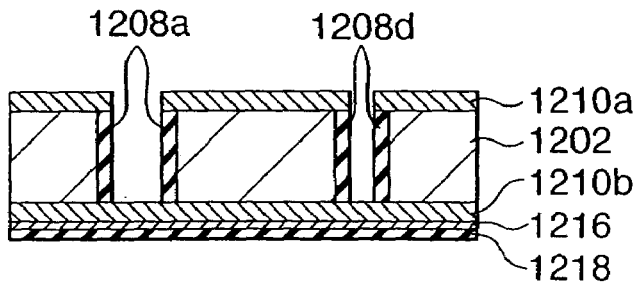
Figure 11F:
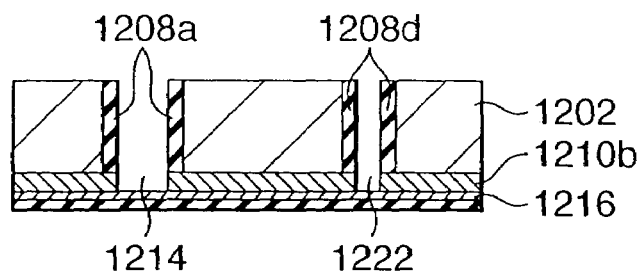
Figure 11G:
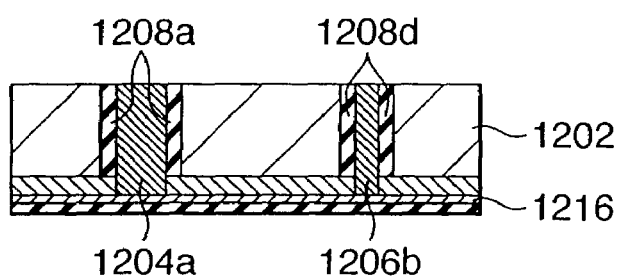
Figure 11H:
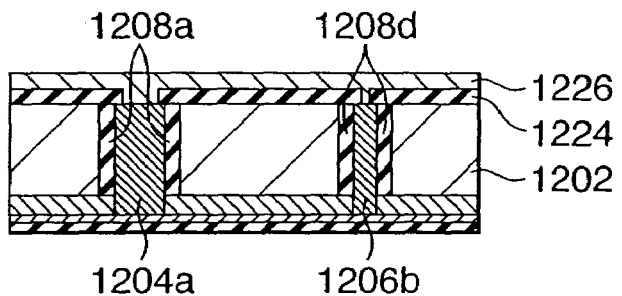
Figure 11I:
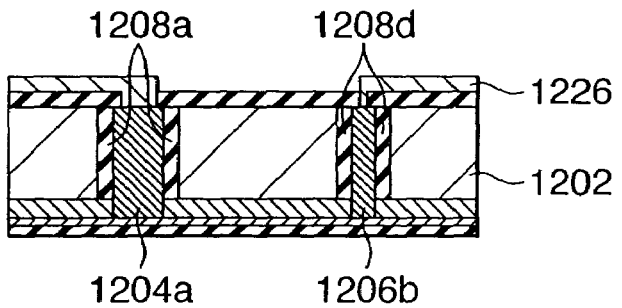
Figure 11J:
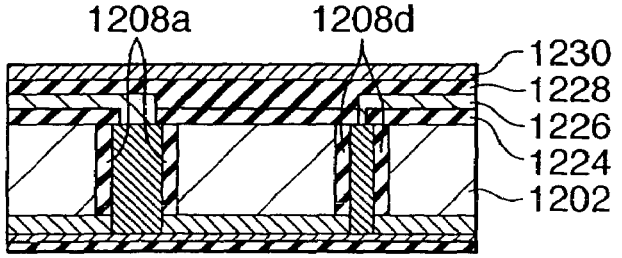
Figure 11K:
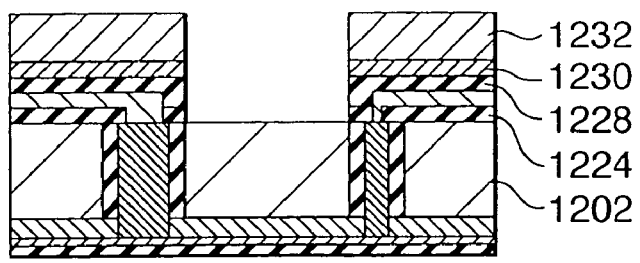
Figure 11L:
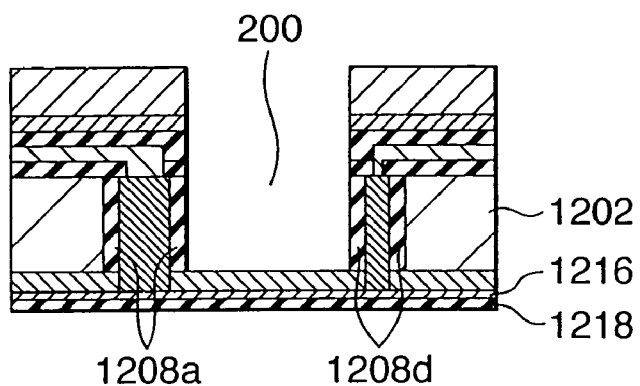
Figure 11M:
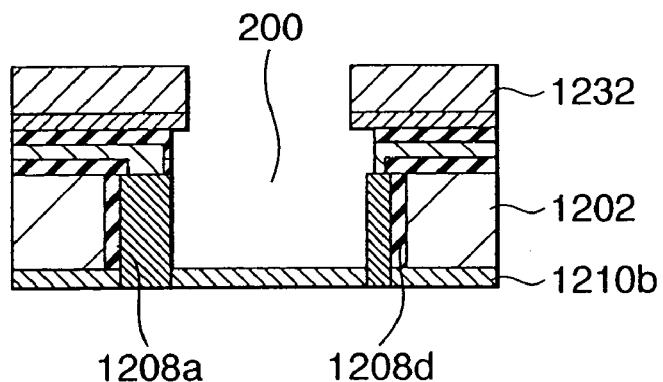
Figure 11N:
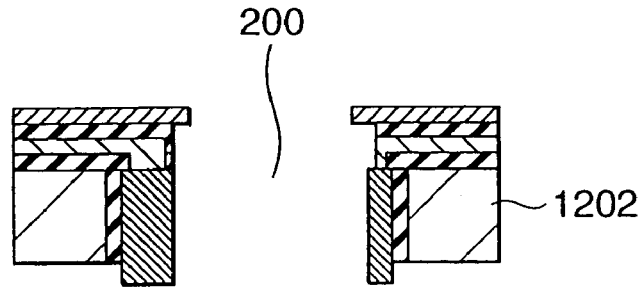

FIGS. 11A to 11N show a method of manufacturing the blanking aperture array device 26 according to the third embodiment. FIGS. 11A to 11N are sectional views of the blanking aperture array device 26 taken along a line B–B' in FIG. 10.

First, as shown in FIG. 11A, the substrate 1202 is prepared. Silicon nitride films 1210a and 1210b are formed on the upper and lower surfaces of the substrate 1202, respectively. The silicon nitride films 1210a and 1210b may be formed either simultaneously or separately. The substrate 1202 is a silicon wafer having, e.g., a diameter of 6 inches and a thickness of 200 μm. Each of the silicon nitride films 1210a and 1210b has a thickness of, e.g., 1 μm.

Next, as shown in FIG. 11B, a resist 1212 is applied to the upper surface of the silicon nitride film 1210a. Exposure and development are performed, and the resist 1212 is removed from regions where the deflection electrodes 1204a and 1204b and conductive layers 1206a and 1206b are to be formed. The silicon nitride film 1210a in the regions where the deflection electrodes 1204a and 1204b and conductive layers 1206a and 1206b are to be formed is removed by etching such as RIE using the resist 1212 as an etching mask.

As shown in FIG. 11C, the substrate 1202 at the portions where the deflection electrodes 1204a and 1204b and conductive layers 1206a and 1206b are to be formed is removed by etching such as ICP-RIE using both or one of the resist 1212 and silicon nitride film 1210b as an etching mask, thereby forming a plurality of openings 1214 and 1222. The silicon nitride film 1210b serves as an etching stopper layer in etching the substrate 1202.

As shown in FIG. 11D, the resist 1212 is removed. After that, the insulating layers 1208a, 1208b, 1208c, and 1208d are formed on the inner walls of the plurality of openings 1214 and 1222 formed in the substrate 1202. The insulating layers 1208a, 1208b, 1208c, and 1208d are formed by, e.g., thermally oxidizing the inner walls of the plurality of openings 1214 and 1222. More specifically, of the inner walls of the plurality of openings 1214 and 1222 formed in the substrate 1202 as a silicon substrate, silicon exposed surfaces except portions covered with the silicon nitride films 1210a and 1210b are selectively thermally oxidized, thereby forming the insulating layers 1208a, 1208b, 1208c, and 1208d as silicon oxide films.

As shown in FIG. 11E, a conductive film 1216 is formed on the silicon nitride film 1210b. An insulating layer 1218 is formed on the conductive film 1216. More specifically, a 50-nm thick Cr film, a 200-nm thick Au film, and a 50-nm thick Cr film are formed in this order by e.g. EB deposition to form the conductive film 1216 having a multilayered structure of Cr/Au/Cr. When the multilayered structure of Cr/Au/Cr is formed as the conductive film 1216, the adhesion between the silicon nitride film 1210b and the conductive film 1216 can be increased. If the adhesion between the silicon nitride film 1210b and the conductive film 1216 has no problem, the conductive film 1216 may be, e.g., an Au film having a single-layered structure. The insulating layer 1218 made of a silicon oxide film is formed on the conductive film 1216 by e.g. plasma CVD. The silicon nitride film 1210b formed in FIG. 11A is used to electrically insulate the substrate 1202 from the conductive film 1216.

As shown in FIG. 11F, the silicon nitride film 1210a and the portions of the silicon nitride film 1210b, which are exposed to the plurality of openings 1214 and 1222, are selectively removed by, e.g., RIE. At this time, without removing the insulating layers 1208a, 1208b, 1208c, and 1208d formed on the sidewalls of the plurality of openings 1214 and 1222, the silicon nitride film 1210b is etched until the conductive film 1216 is exposed to the plurality of openings 1214 and 1222. In addition, the Cr film of the conductive film 1216 is etched until the Au film is exposed. In another example, without removing the insulating layers 1208a, 1208b, 1208c, and 1208d formed on the sidewalls of the plurality of openings 1214 and 1222, the silicon nitride film 1210a and the portions of the silicon nitride film 1210b, which are exposed to the plurality of openings 1214 and 1222, may be removed by wet etching using hot phosphoric acid. After that, the Cr film of the conductive film 1216 may be removed by etching in the same way.

As shown in FIG. 11G, the deflection electrodes 1204a and 1204b and conductive layers 1206a and 1206b are formed by selectively executing electrolytic plating in the plurality of openings 1214 and 1222 by using the Au film of the conductive film 1216 as a plating electrode (seed layer) and filling the openings 1214 and 1222 with a conductive material. The deflection electrodes 1204a and 1204b and conductive layers 1206a and 1206b are made of, e.g., Cu or Au. After the deflection electrodes 1204a and 1204b and conductive layers 1206a and 1206b are formed, an unnecessary conductive material is removed by, e.g., CMP. In another example, after Cr films are formed on the surfaces of the insulating layers 1208a, 1208b, 1208c, and 1208d exposed to the plurality of openings 1214 and 1222 by sputtering, the interiors of the Cr films of the plurality of openings 1214 and 1222 may be filled with the conductive material to form the deflection electrodes 1204a and 1204b and conductive layers 1206a and 1206b. With this structure, the adhesion between the deflection electrodes 1204a and 1204b and conductive layers 1206a and 1206b and the insulating layers 1208a, 1208b, 1208c, and 1208d can be increased.

As shown in FIG. 11H, an insulating layer 1224 and interconnection layer 1226 are formed on the substrate 1202. More specifically, the insulating layer 1224 as a silicon oxide film having a thickness of about 1 μm is formed by e.g. plasma CVD. A resist is applied to the surface of the insulating layer 1224. Exposure and development are performed, and the resist above the deflection electrodes 1204a and 1204b and conductive layers 1206a and 1206b is removed. The insulating layer 1224 is removed by etching such as RIE using the resist as an etching mask. After the resist is removed, a Cr film and Au film are deposited on the surface of the insulating layer 1224 in this order by sputtering, thereby forming the interconnection layer 1226.

As shown in FIG. 11I, an interconnection pattern is formed on the interconnection layer 1226. More specifically, a resist is applied to the surface of the interconnection layer 1226. Exposure and development are performed, and the resist is removed from a region where no interconnection is to be formed. The interconnection layer 1226 is removed by etching such as RIE using the resist as an etching mask, thereby forming the interconnection pattern. Then, the resist is removed.

As shown in FIG. 11J, an insulating layer 1228 and conductive film 1230 are formed on the insulating layer 1224 and interconnection layer 1226. More specifically, the insulating layer 1228 as a silicon oxide film having a thickness of about 1 μm is formed by e.g. plasma CVD. A Cr film and Au film are deposited on the surface of the insulating layer 1228 in this order by sputtering to form the conductive film 1230. The conductive film 1230 is grounded and thus functions as an anti-charge-up metal layer for the insulating layer 1228.

As shown in FIG. 11K, a resist 1232 is applied to the surface of the conductive film 1230. Exposure and development are performed, and the resist 1232 is removed from a region where an opening 200 through which an electron beam should pass. Using the resist 1232 as an etching mask, the conductive film 1230 is removed by etching such as ion milling, and the insulating layers 1224 and 1228 are removed by etching such as RIE.

As shown in FIG. 11L, the substrate 1202 is removed by etching such as ICP-RIE using the resist 1232 as an etching mask. At this time, the opening 200 having an I shape when viewed from the upper side is formed.

As shown in FIG. 1M, the portions of the insulating layers 1208a, 1208b, 1208c, and 1208d, which are exposed to the opening 200, the insulating layer 1218, and the conductive film 1216 are removed by etching. More specifically, while leaving the resist 1232, the insulating layers 1208a, 1208b, 1208c, and 1208d as silicon oxide films on the sidewall of the opening 200 are removed by wet etching using a solution mixture of, e.g., HF and NH₄F. Simultaneously, the insulating layer 1218 is also removed by wet etching. The Cr film of the conductive film 1216 is removed by wet etching using a solution mixture of, e.g., cerium ammonium nitrate (IV), perchloric acid and water, The Au film of the conductive film 1216 is removed by wet etching using a solution mixture of, e.g., potassium iodide, iodine, and water.

As shown in FIG. 11N, after the resist 1232 is removed, the silicon nitride film 1210b is removed by etching. More specifically, the silicon nitride film 1210b is removed by wet etching using, e.g., hot phosphoric acid to make the opening 200 through. In this embodiment, the lower surface of the substrate 1202 is exposed. However, a conductive film may be formed on the lower surface of the substrate 1202 to prevent the substrate 1202 from being charged up. In the above way, the blanking aperture array device 26 is completed by the manufacturing method shown in FIGS. 11A to 11N.

According to the blanking aperture array device 26 according to the third embodiment, since the deflection electrodes 1204a and 1204b and conductive layers 1206a and 1206b have the same structure, the deflection electrodes 1204a and 1204b and conductive layers 1206a and 1206b can be simultaneously formed. For this reason, the number of steps in manufacturing the blanking aperture array device 26 can be decreased.

[Fourth Embodiment]

The fourth embodiment will be described next. The arrangement of an electron beam exposure apparatus 100, the structure of a blanking aperture array device 26, and the structure of an aperture portion 160 are the same as in the first embodiment (FIGS. 1 to 3).

Figure 12:
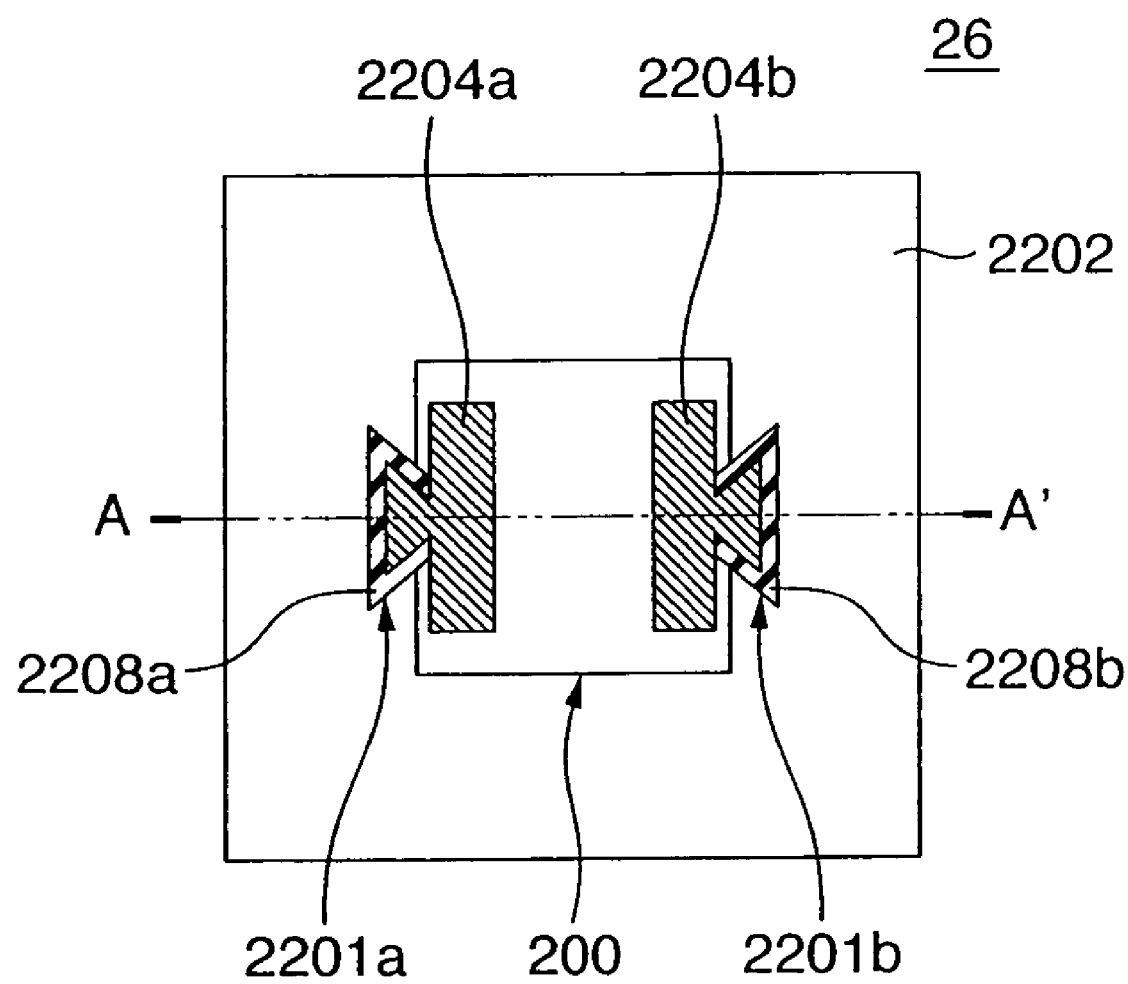
FIG. 12 is a view showing the detailed structure of a blanking aperture array device 26 according to the fourth embodiment.

FIG. 12 shows the detailed structure of the blanking aperture array device 26 according to the fourth embodiment. The blanking aperture array device 26 comprises: a substrate 2202 having a through hole 200 through which an electron beam should pass and two groove portions 2201a and 2201b formed in two side surfaces opposite to each other inside the through hole 200; two deflection electrodes 2204a and 2204b which oppose each other in the through hole 200 so as to deflect an electron beam and are at least partially buried in the two groove portions 2201a and 2201b; and insulating layers 2208a and 2208b formed between the substrate 2202 and the buried portion of the deflection electrode 2204a and between the substrate 2202 and the buried portion of the deflection electrode 2204b in the groove portions 2201a and 2201b.

The groove portions 2201a and 2201b have shapes to lock the buried portions of the deflection electrodes 2204a and 2204b in the groove portions 2201a and 2201b to prevent the deflection electrodes 2204a and 2204b from separating from the substrate 2202. More specifically, in the section almost perpendicular to the electron beam irradiation direction, i.e., the direction of thickness of the substrate 2202, preferably, the maximum width of the buried portion of the deflection electrode 2204a in the groove portion 2201a is larger than the width of the upper surface of the groove portion 2201a, and the maximum width of the buried portion of the deflection electrode 2204b in the groove portion 2201b is larger than the width of the upper surface of the groove portion 2201b. In addition, the maximum width of each of the deflection electrodes 2204a and 2204b in the through hole 200 is preferably larger than the width of the upper surface of a corresponding one of the groove portions 2201a and 2201b. The upper surface of each of the groove portions 2201a and 2201b indicates the interface (contact surface) between the through hole 200 and each of the groove portions 2201a and 2201b.

For example, as shown in FIG. 12, the buried portions of the deflection electrodes 2204a and 2204b in the groove portions 2201a and 2201b and the groove portions 2201a and 2201b have trapezoidal columnar shapes. The deflection electrodes 2204a and 2204b are held while engaging with the groove portions 2201a and 2201b, respectively.

The groove portions 2201a and 2201b may be formed partially in the direction of thickness of the substrate 2202 or from the upper surface to the lower surface. The deflection electrodes 2204a and 2204b may be formed partially in the direction of thickness of the substrate 2202 or from the upper surface to the lower surface. The buried portions of the deflection electrodes 2204a and 2204b in the groove portions 2201a and 2201b may be formed partially in the direction of thickness of the substrate 2202 or from the upper surface to the lower surface.

The substrate 2202 is, e.g., a silicon substrate. The insulating layers 2208a and 2208b are oxide films formed by thermally oxidizing the substrate 2202 and, for example, silicon oxide films formed by thermally oxidizing a silicon substrate. The insulating layers 2208a and 2208b may be formed only inside the groove portions 2201a and 2201b. The insulating layers 2208a and 2208b may be formed in the through hole 200 across the interfaces from the groove portions 2201a and 2201b. That is, the insulating layers 2208a and 2208b may be partially exposed to the through hole 200 from the groove portions 2201a and 2201b.

The groove portion 2201a and deflection electrode 2204a preferably have similar shapes. The groove portion 2201b and deflection electrode 2204b preferably have similar shapes. In another example, each of the groove portions 2201a and 2201b may have a widest portion between the upper surface and the bottom surface in the section almost perpendicular to the direction of thickness of the substrate 2202. Each of the groove portions 2201a and 2201b may have a curved bottom surface. The groove portions 2201a and 2201b may extend from the center of the through hole 200 to the deflection electrodes 2204a and 2204b, or temporarily become narrow and then extend. Each of the groove portions 2201a and 2201b may be branched into a plurality of parts. The plurality of parts may extend from the center of the through hole 200 to the deflection electrodes 2204a and 2204b. More specifically, in the section almost perpendicular to the direction of thickness of the substrate 2202, the groove portions 2201a and 2201b only need to have side surfaces for which normals heading from the groove portions 2201a and 2201b to the deflection electrodes 2204a and 2204b separate from the through hole 200.

According to the blanking aperture array device 26 of the fourth embodiment, the deflection electrodes 2204a and 2204b are buried in the groove portions 2201a and 2201b. For this reason, the deflection electrodes 2204a and 2204b can be prevented from peeling off from the substrate 2202.

Figure 13A:
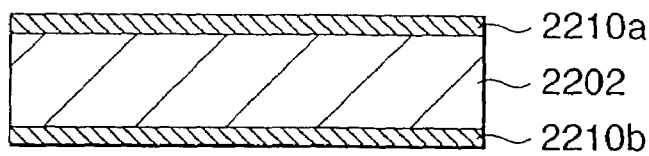
FIGS. 13A to 13N are views showing a method of manufacturing the blanking aperture array device 26 according to the fourth embodiment.
Figure 13B:
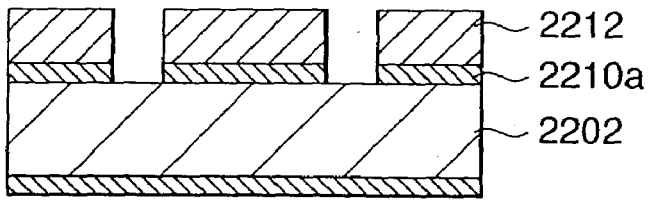
Figure 13C:
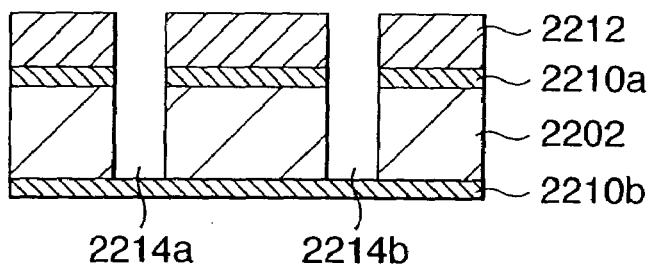
Figure 13D:
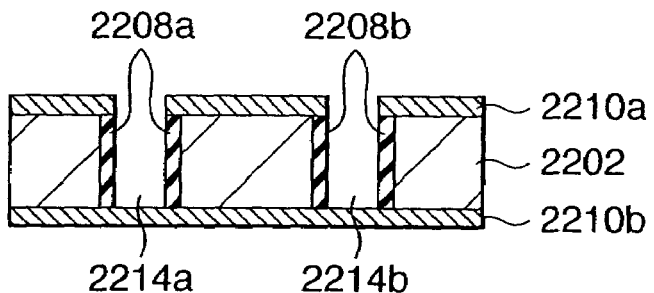
Figure 13E:
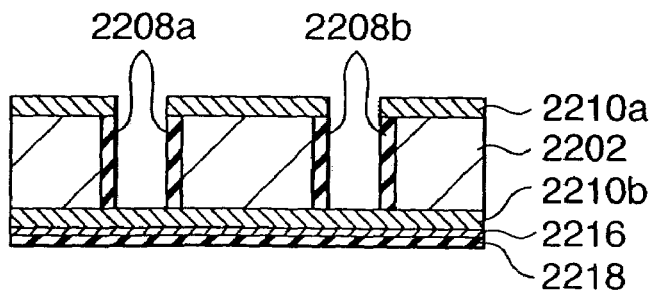
Figure 13F:
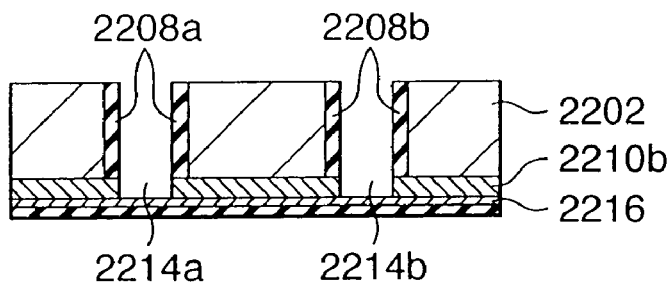
Figure 13G:
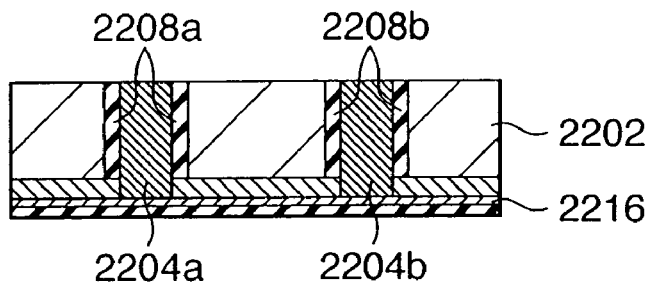
Figure 13H:
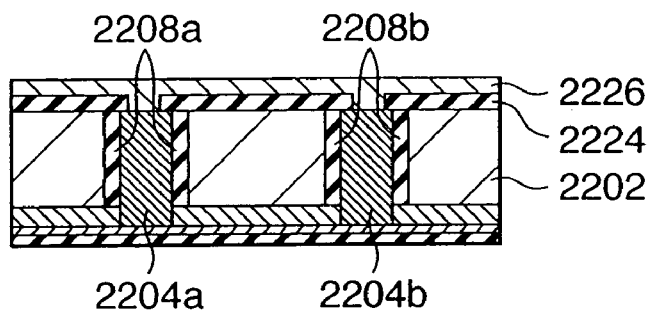
Figure 13I:
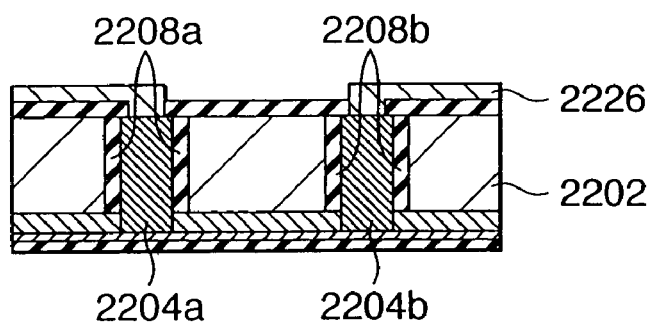
Figure 13J:
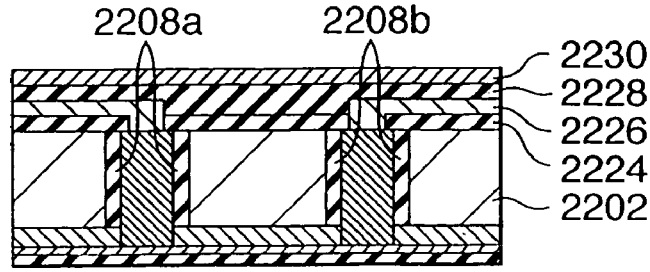
Figure 13K:
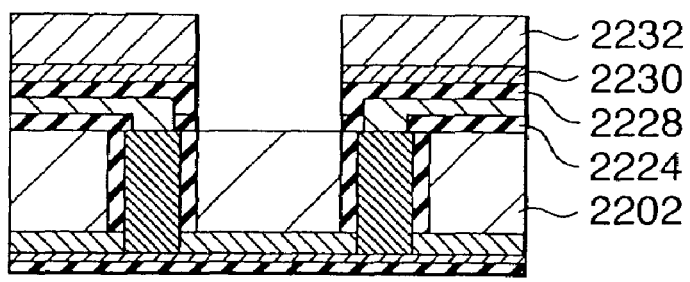
Figure 13L:
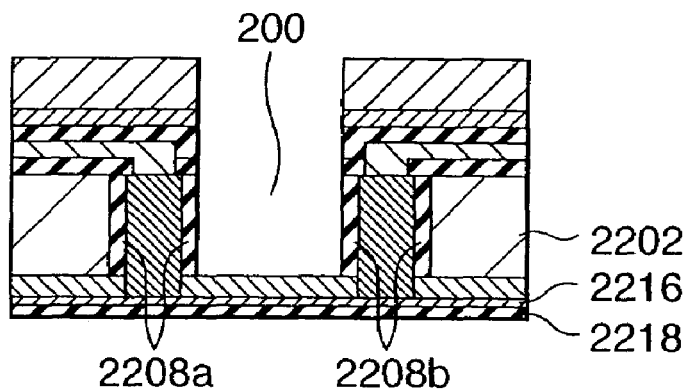
Figure 13M:
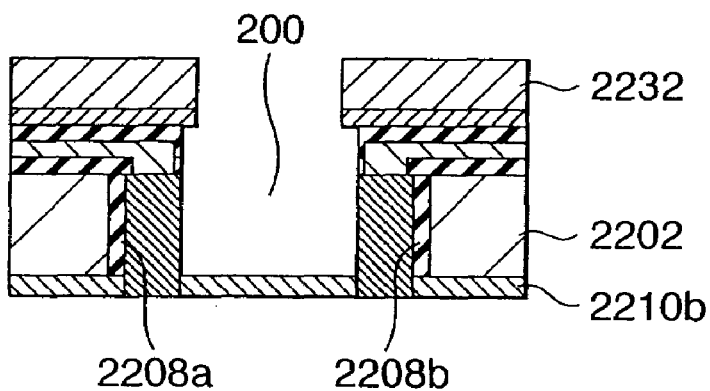
Figure 13N:
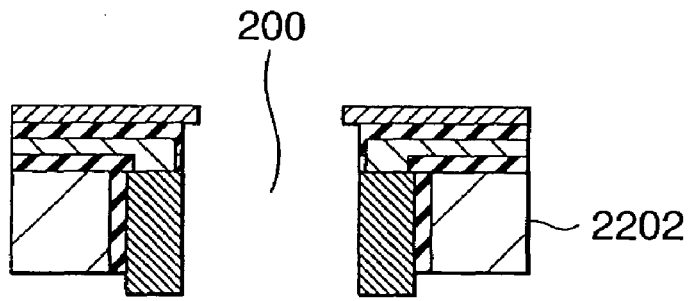

FIGS. 13A to 13N show a method of manufacturing the blanking aperture array device 26. FIGS. 13A to 13N show the section of the blanking aperture array device 26 taken along a line A–A' in FIG. 12.

First, as shown in FIG. 13A, the substrate 2202 is prepared. Silicon nitride films 2210a and 2210b are formed on the upper and lower surfaces of the substrate 2202, respectively. The silicon nitride films 2210a and 2210b may be formed either simultaneously or separately. The substrate 2202 is a silicon wafer having, e.g., a diameter of 6 inches and a thickness of 200 μm. Each of the silicon nitride films 2210a and 2210b has a thickness of, e.g., 1 μm.

Next, as shown in FIG. 13B, a resist 2212 is applied to the upper surface of the silicon nitride film 2210a. Exposure and development are performed, and the resist 2212 is removed from regions where the deflection electrodes 2204a and 2204b are to be formed. The silicon nitride film 2210a in the regions where the deflection electrodes 2204a and 2204b are to be formed is removed by etching such as reactive ion etching (RIE) using the resist 2212 as an etching mask.

As shown in FIG. 13C, the substrate 2202 at the portions where the deflection electrodes 2204a and 2204b are to be formed is removed by etching such as inductively coupled plasma etching (ICP-RIE) using both or one of the resist 2212 and silicon nitride film 2210a as an etching mask, thereby forming a plurality of openings 2214a and 2214b. The openings 2214a and 2214b include spaces where the groove portions 2201a and 2201b shown in FIG. 12 should be formed. Openings where the deflection electrodes 2204a and 2204b should be formed are formed in the substrate 2202 such that the openings have shapes to lock the buried portions of the deflection electrodes 2204a and 2204b in the groove portions 2201a and 2201b so that the groove portions 2201a and 2201b prevent the deflection electrodes 2204a and 2204b from separating from the substrate 2202. The openings 2214a and 2214b where the deflection electrodes 2204a and 2204b should be formed are formed such that the maximum width of the buried portion of each of the deflection electrodes 2204a and 2204b in the groove portions 2201a and 2201b becomes larger than the width of the upper surface of a corresponding one of the groove portions 2201a and 2201b. The silicon nitride film 2210b serves as an etching stopper layer in etching the substrate 2202.

As shown in FIG. 13D, the resist 2212 is removed. After that, the insulating layers 2208a and 2208b are formed on the inner walls of the openings 2214a and 2214b formed in the substrate 2202. The insulating layers 2208a and 2208b are formed by, e.g., thermally oxidizing the inner walls of the openings 2214a and 2214b. More specifically, of the inner walls of the openings 2214a and 2214b formed in the substrate 2202 as a silicon substrate, silicon exposed surfaces except portions covered with the silicon nitride films 2210a and 2210b are selectively thermally oxidized, thereby forming the insulating layers 2208a and 2208b as silicon oxide films.

As shown in FIG. 13E, a conductive film 2216 is formed on the silicon nitride film 2210b. An insulating layer 2218 is formed on the conductive film 2216. More specifically, a 50-nm thick Cr film, a 20-nm thick Au film, and a 50-nm thick Cr film are formed in this order by e.g. EB deposition to form the conductive film 2216 having a multilayered structure of Cr/Au/Cr. When the multilayered structure of Cr/Au/Cr is formed as the conductive film 2216, the adhesion between the silicon nitride film 2210b and the conductive film 2216 can be increased. If the adhesion between the silicon nitride film 2210b and the conductive film 2216 has no problem, the conductive film 2216 may be, e.g., an Au film having a single-layered structure. The insulating layer 2218 made of a silicon oxide film is formed on the conductive film 2216 by e.g. plasma chemical vapor deposition (CVD). The silicon nitride film 2210b formed in FIG. 13A is used to electrically insulate the substrate 2202 from the conductive film 2216.

As shown in FIG. 13F, the silicon nitride film 2210a and the portions of the silicon nitride film 2210b, which are exposed to the openings 2214a and 2214b, are selectively removed by, e.g., RIE. At this time, without removing the insulating layers 2208a and 2208b formed on the sidewalls of the openings 2214a and 2214b, the silicon nitride film 2210b is etched until the conductive film 2216 is exposed to the openings 2214a and 2214b. In addition, the Cr film of the conductive film 2216 is etched until the Au film is exposed. In another example, without removing the insulating layers 2208a and 2208b formed on the sidewalls of the openings 2214a and 2214b, the silicon nitride film 2210a, the portions of the silicon nitride film 2210b, which are exposed to the openings 2214a and 2214b, and the Cr film of the conductive film 2216 may be removed by wet etching using hot phosphoric acid.

As shown in FIG. 13G, the deflection electrodes 2204a and 2204b are formed inside the insulating layers 2208a and 2208b, respectively, by selectively executing electrolytic plating in the openings 2214a and 2214b by using the Au film of the conductive film 2216 as a plating electrode (seed layer). The deflection electrodes 2204a and 2204b are made of, e.g., Cu. After the deflection electrodes 2204a and 2204b are formed, an unnecessary conductive material is removed by, e.g., chemical mechanical polishing (CMP). In another example, after Cr films are formed on the surfaces of the insulating layers 2208a and 2208b exposed to the openings 2214a and 2214b by sputtering, the deflection electrodes 2204a and 2204b may be formed inside the Cr films in the openings 2214a and 2214b. With this structure, the adhesion between the deflection electrodes 2204a and 2204b and the insulating layers 2208a and 2208b can be increased.

As shown in FIG. 13H, an insulating layer 2224 and interconnection layer 2226 are formed on the substrate 2202. More specifically, the insulating layer 2224 as a silicon oxide film having a thickness of about 1 µm is formed by e.g. plasma CVD. A resist is applied to the surface of the insulating layer 2224. Exposure and development are performed, and the resist above the deflection electrodes 2204a and 2204b is removed. The insulating layer 2224 is removed by etching such as RIE using the resist as an etching mask. After the resist is removed, a Cr film and Au film are deposited on the surface of the insulating layer 2224 in this order by sputtering, thereby forming the interconnection layer 2226 electrically connected to the deflection electrodes 2204a and 2204b.

As shown in FIG. 13I, an interconnection pattern is formed on the interconnection layer 2226. More specifically, a resist is applied to the surface of the interconnection layer 2226. Exposure and development are performed, and the resist is removed from a region where no interconnection is to be formed. The interconnection layer 2226 is removed by etching such as RIE using the resist as an etching mask, thereby forming the interconnection pattern. Then, the resist is removed.

As shown in FIG. 13J, an insulating layer 2228 and conductive film 2230 are formed on the insulating layer 2224 and interconnection layer 2226. More specifically, the insulating layer 2228 as a silicon oxide film having a thickness of about 1 µm is formed by e.g. plasma CVD. A Cr film and Au film are deposited on the surface of the insulating layer 2228 in this order by sputtering to form the conductive film 2230. The conductive film 2230 is grounded and thus functions as an anti-charge-up metal layer for the insulating layer 2228.

As shown in FIG. 13K, a resist 2232 is applied to the surface of the conductive film 2230. Exposure and development are performed, and the resist 2232 is removed from a region where the through hole 200 through which an electron beam should pass is to be formed. Using the resist 2232 as an etching mask, the conductive film 2230 is removed by etching such as ion milling, and the insulating layers 2224 and 2228 are removed by etching such as RIE.

As shown in FIG. 13L, the substrate 2202 is removed by etching such as ICP-RIE using the resist 2232 as an etching mask, thereby forming the through hole 200 through which the electron beam should pass in the substrate 2202.

As shown in FIG. 13M, parts of the insulating layers 2208a and 2208b, the insulating layer 2218, and the conductive film 2216 are removed by etching. More specifically, while leaving the insulating layers 2208a and 2208b in the groove portions 2201a and 2201b, the insulating layers 2208a and 2208b on the sidewall of the through hole 200 are removed by wet etching using a solution mixture of, e.g., HF and NH₄F. Simultaneously, the insulating layer 2218 is also removed by wet etching. The Cr film of the conductive film 2216 is removed by wet etching using a solution mixture of, e.g., cerium ammonium nitrate (IV), perchloric acid, and water. The Au film of the conductive film 2216 is removed by wet etching using a solution mixture of, e.g., potassium iodide, iodine, and water.

As shown in FIG. 13N, after the resist 2232 is removed, the silicon nitride film 2210b is removed by etching. More specifically, the silicon nitride film 2210b is removed by wet etching using, e.g., hot phosphoric acid to make the through hole 200 through. In this embodiment, the lower surface of the substrate 2202 is exposed. However, a conductive film may be formed on the lower surface of the substrate 2202 to prevent the substrate 2202 from being charged up. In the above way, the blanking aperture array device 26 is completed by the manufacturing method shown in FIGS. 13A to 13N.

According to the blanking aperture array device 26 of the fourth embodiment, the deflection electrodes 2204a and 2204b are buried in the groove portions 2201a and 2201b. Even when the deflection electrodes 2204a and 2204b are formed by plating inside the insulating layers 2208a and 2208b by using a material having a relatively large residual stress after plating growth, the peeling resistance of the deflection electrodes 2204a and 2204b and insulating layers 2208a and 2208b can be increased. Hence, the reliability of electron beam deflection by the blanking aperture array device 26 can be increased. In addition, the service life of the blanking aperture array device 26 can be prolonged.

The present invention has been described using the embodiments. However, the technical scope of the invention is not limited to the above embodiments, and various changes and modifications can be made in the above embodiments. The changes and modifications can also be incorporated in the technical scope of the invention, as can be seen from the appended claims.

In addition, those skilled in the art can readily understand that the arrangements of the embodiments can appropriately be combined by, e.g., using the deflection electrodes 206a and 206b of the first embodiment (FIG. 5) as the deflection electrodes of the second to fourth embodiments.

As is apparent from the above description, according to the present invention, there can be provided a deflector which accurately deflects a charged particle beam and has a long service life, a method of manufacturing the deflector, and a charged particle beam exposure apparatus having the deflector.

As many apparently widely different embodiments of the present invention can be made without departing from the spirit and scope thereof, it is to be understood that the invention is not limited to the specific embodiments thereof except as defined in the claims.

What is claimed is:

1. A deflector which deflects a charged particle beam, comprising:
   a substrate having a through hole through which the charged particle beam should pass and two groove portions respectively formed on two opposing side surfaces inside the through hole; and
   two deflection electrodes which are at least partially buried in the two groove portions,
   wherein each of the groove portions has a shape to lock the buried portion of said deflection electrode in the groove portion to prevent said deflection electrode from separating from said substrate.

2. The deflector according to claim 1, wherein in a section substantially perpendicular to a direction of a thickness of said substrate, a maximum width of the buried portion of said deflection electrode in the groove portion is larger than a width of an upper surface of the groove portion.

3. The deflector according to claim 2, wherein the buried portion of said deflection electrode in the groove portion and the groove portion have trapezoidal columnar shapes, and said deflection electrode engages with the groove portion.

4. The deflector according to claim 1, further comprising an insulating layer between the groove portion and the buried portion of said deflection electrode in the groove portion,
   wherein said substrate is a silicon substrate, and
   said insulating layer is a silicon oxide film formed by thermally oxidizing the silicon substrate.

5. A charged particle beam exposure apparatus which exposes a wafer by a charged particle beam, comprising:
   a charged particle beam generation section which generates the charged particle beam; and
   a deflector which deflects the charged particle beam to irradiate a desired position on the wafer with the charged particle beam,
   wherein said deflector has
   a substrate having a through hole through which the charged particle beam should pass and two groove portions respectively formed on two opposing side surfaces inside the through hole, and
   two deflection electrodes which are at least partially buried in the two groove portions, and
   each of the groove portions has a shape to lock the buried portion of said deflection electrode in the groove portion to prevent said deflection electrode from separating from said substrate.

* * * * *